(12) United States Patent
Nakahira et al.

(10) Patent No.: US 8,268,400 B2
(45) Date of Patent: Sep. 18, 2012

(54) METHOD AND APPARATUS FOR PRODUCING CONDUCTIVE MATERIAL

(75) Inventors: Shinichi Nakahira, Fujinomiya (JP); Kentaro Okazaki, Fujinomiya (JP); Yasuaki Miyauchi, Tokyo (JP)

(73) Assignee: Fujifilm Corporation, Tokyo (JP)

( * ) Notice: Subject to any disclaimer, the term of this patent is extended or adjusted under 35 U.S.C. 154(b) by 988 days.

(21) Appl. No.: 12/237,759

(22) Filed: Sep. 25, 2008

(65) Prior Publication Data

US 2009/0087800 A1    Apr. 2, 2009

(30) Foreign Application Priority Data

Sep. 28, 2007    (JP) ................. 2007-254452

(51) Int. Cl.
*B05D 3/10* (2006.01)
*B05D 1/18* (2006.01)

(52) U.S. Cl. ..................... 427/304; 427/443.1
(58) Field of Classification Search .......... 427/304, 427/305, 306, 532, 540, 443.1; 205/80
See application file for complete search history.

(56) References Cited

U.S. PATENT DOCUMENTS

| | | | |
|---|---|---|---|
| 6,824,666 B2 * | 11/2004 | Gandikota et al. ............ 205/183 |
| 2004/0069650 A1 * | 4/2004 | Yoshimura et al. ............ 205/164 |
| 2005/0031788 A1 * | 2/2005 | McCaskie et al. ............ 427/305 |
| 2005/0139478 A1 * | 6/2005 | Chen ............................. 205/104 |
| 2009/0029125 A1 * | 1/2009 | Nakahira ....................... 428/209 |

FOREIGN PATENT DOCUMENTS

| | | |
|---|---|---|
| JP | 61-034180 | 2/1986 |
| JP | 02-175895 | 7/1990 |
| JP | 05-016281 | 1/1993 |
| JP | 10-163673 | 6/1998 |
| JP | 11-170420 | 6/1999 |
| JP | 2003-318593 | 11/2003 |
| JP | 2004-018975 | 1/2004 |
| JP | 2004172554 A * | 6/2004 |
| JP | 2004-221564 | 8/2004 |
| JP | 2006-228836 | 8/2006 |
| JP | 2007-009326 | 1/2007 |
| JP | 2007-012314 | 1/2007 |
| WO | 01/51276 | 7/2001 |
| WO | WO 2006088026 A1 * | 8/2006 |

* cited by examiner

*Primary Examiner* — Dah-Wei Yuan
*Assistant Examiner* — Nga Leung V Law
(74) *Attorney, Agent, or Firm* — Young & Thompson

(57) ABSTRACT

A photosensitive film, which has a transparent support and a silver salt emulsion layer containing a silver salt formed thereon, is exposed and developed to form a metallic silver portion. The base material to be plated is electrified in a solution containing a metal ion, using the metallic silver portion as a cathode. Then, the electrified base material is subjected to an electroless plating treatment to form a plated layer only on the metallic silver portion. The metal ion in the solution is preferably an ion of copper, nickel, cobalt, or tin.

12 Claims, 7 Drawing Sheets

METHOD AND APPARATUS FOR PRODUCING CONDUCTIVE MATERIAL

BACKGROUND OF THE INVENTION

1. Field of the Invention

The present invention relates to a method and an apparatus for producing a conductive material. For example, the conductive material is suitable for use in electromagnetic shielding materials for blocking electromagnetic waves from display devices such as PDPs (plasma display panels) and liquid crystal displays, transparent electrodes of electronic devices such as touch panels, printed circuits of electronic devices, antenna circuits of contactless ICs, etc.

2. Description of the Related Art

A conductive material such as an electromagnetic shielding film for PDP is required to have both conductivity and light transmittability. A material having a transparent substrate and a mesh-patterned conductive layer of a fine metal wire, etc. has been known as such a conductive material, and it can be produced by (1) a method containing the steps of forming a thin copper layer on a transparent substrate by bonding, electroless plating, etc., and subjecting the layer to a photolithography process to etch the layer into a pattern (Japanese Laid-Open Patent Publication Nos. 05-016281 and 10-163673, etc.), (2) a method containing the steps of printing an ink containing an electroless plating catalyst particle such as a palladium particle into a pattern on a transparent substrate, and subjecting the printed ink to an electroless plating treatment to form a conductive layer thereon (Japanese Laid-Open Patent Publication Nos. 11-170420 and 2003-318593, etc.), or (3) a method containing the steps of exposing a photosensitive silver halide layer formed on a transparent substrate to form a patterned developed silver, and subjecting the developed silver to a plating treatment to form a patterned conductive layer thereon (International Patent Publication No. WO 01/51276, Japanese Laid-Open Patent Publication No. 2004-221564, etc.)

The method of (1), which contains etching and patterning the thin copper layer by the photolithography process, is advantageously capable of micromachining. Thus, by using the method, a mesh having a high aperture ratio can be formed, and a conductive material having high conductivity and transparency can be obtained easily. However, this method disadvantageously requires complicated processes of formation of the thin copper layer on the substrate, formation of a photosensitive resin layer on the thin copper layer, exposure, removal of the resin layer, removal of the thin copper layer by etching, etc. Further, most of the formed thin copper layer must be removed, thereby resulting in increased cost for waste liquid treatment.

The method of (2), which contains printing the plating catalyst into a pattern and subjecting the printed catalyst to the plating treatment, is disadvantageous in that the printed wire cannot be formed with a small width easily. Thus, the conductive layer often has an excessively large width, causing deterioration of the light transmittance and image quality (e.g. moire generation) in a display device. Furthermore, because a particle of the expensive palladium or another metal having a lower activity (such as copper or silver) is used as the electroless plating catalyst, this method has a disadvantage of high cost or low productivity.

The method of (3), which uses the silver halide, contains simpler processes as compared with the photolithography method, and can form the fine wire more easily as compared with the printing method. Furthermore, this method is suitable for forming a seamless continuous conductive layer. However, the developed silver exhibits a low activity in the electroplating or electroless plating treatment, so that the plating time is increased. Thus, this method has a disadvantage of low productivity.

In a technique for increasing the electroless plating activity of the developed silver described in Japanese Laid-Open Patent Publication No. 2004-221564, the developed silver is treated with a palladium-containing solution to increase the electroless plating rate. However, in this technique, the expensive palladium catalyst is needed, and so-called fog silver, which is developed silver unexpectedly generated in a portion other than the conductive layer, is activated by the palladium, whereby a plated layer is undesirably formed in the portion, causing a so-called plating fog. In a technique described in Japanese Laid-Open Patent Publication No. 2007-012314, the thiosulfate salt concentration of a fixer is controlled, whereby the surface resistance is lowered after the electroless plating, to reduce the plating time. However, in this technique, palladium chloride is used as a catalyst, and the plating rate is insufficient. In a technique described in Japanese Laid-Open Patent Publication No. 2006-228836, the electroless plating activity of the developed silver is improved without palladium catalysts by immersing in an activation solution containing sodium borohydride, silver nitrate, etc. However, this technique cannot be practically used because of the low stability and high cost of the activation solution.

In a technique for increasing the electroless plating rate of the developed silver or another component, as disclosed in Japanese Laid-Open Patent Publication Nos. 61-034180, 02-175895, and 2004-018975, etc., a current or a negative electric potential is applied using the material to be plated as a negative electrode in an electroless plating solution. However, in this technique, the plating metal is disadvantageously deposited also on a counter positive electrode placed in the electroless plating solution. Though the plating on the positive electrode can be prevented by controlling the timing of taking it out from an electroless plating bath, putting it in the electroless plating bath, or applying the current, this technique requires complicated operation and is unsuitable for continuous mass production of the conductive film.

Also electroplating of the developed silver, not the electroless plating, has been tested. However, in this technique, as described in Japanese Laid-Open Patent Publication No. 2007-009326, etc., the developed silver has a low conductivity, so that the plated layer is ununiformly formed only in the vicinity of an electrode and a low-conductive portion. Further, the applied voltage or current must be controlled to prevent wire breaking due to Joule heat, whereby the metal is generally deposited only in a limited amount. To increase the plating metal amount, the electroplating has to be carried out at a low rate under a controlled current, or using a multistage apparatus as described in this patent publication. Therefore, this technique cannot be practically used. This problem is caused not only in the method using the developed silver, but also in the method of printing the fine metal particle into a pattern or the like. Thus, in a case where the fine wire is formed from the dispersion of conductive fine particles of a metal, etc. and subjected to an electroplating treatment, the current for electroplating is limited because of the contact resistance between the conductive fine particles and the insufficient conductivity of the fine wire. Thus, the electroplating has to be carried out at a low rate or in a multistage apparatus to increase the plating amount. When the density or application amount of the conductive fine particles is increased to improve the conductivity, the wire width is increased and the adhesion between the conductive layer and the substrate is deteriorated. When the electric resistance between the conductive fine particles is lowered beforehand by sintering, etc., a complicated operation is required, and the substrate is often thermally deformed.

Accordingly, there is a demand for a conductive metal layer producing method with high productivity, capable of forming a fine wire easily.

SUMMARY OF THE INVENTION

In view of the above problems, an object of the present invention is to provide a method and an apparatus capable of highly efficiently producing a conductive material having a patterned fine conductive metal layer, more particularly a method and an apparatus capable of forming a continuous plated metal layer on a patterned developed silver or a patterned conductive fine particle deposited by printing, etc. to increase a plating rate, thereby highly efficiently producing a conductive material having a patterned conductive metal layer.

According to the present invention, there are provided the following method and apparatus to achieve the above object.

[1] A method according to the present invention for producing a conductive material, comprising: a depositing step of depositing a conductive fine particle on a surface of a base material; an electrifying step of electrifying the base material in a solution containing a metal ion, using the conductive fine particle as a cathode; and an electroless plating step of subjecting the base material to an electroless plating treatment to deposit a metal on the conductive fine particle.

[2] A method according to [1], wherein a current density in the electrifying step is 0.01 to 10 A/dm$^2$.

[3] A method according to [1] or [2], wherein an electrifying time in the electrifying step is 0.01 to 60 seconds.

[4] A method according to any one of [1] to [3], wherein the metal ion is an ion of at least one metal selected from the group consisting of iron, nickel, copper, silver, cobalt, zinc and tin.

[5] A method according to any one of [1] to [4], wherein an amount of metal plated in the electrifying step is 1/10 or less times an amount of metal plated in the electroless plating step.

[6] A method according to any one of [1] to [5], wherein the solution containing the metal ion further contains a complexing agent.

[7] A method according to [6], wherein the complexing agent comprises at least one salt selected from the group consisting of ethylenediaminetetraacetate, triethanolamine, tartrate, acetate, citrate and pyrophosphate.

[8] A method according to [6], wherein the complexing agent comprises ethylenediaminetetraacetate.

[9] A method according to [8], wherein a content of the complexing agent is 0.0001 to 1 mol/L.

[10] A method according to [1], wherein a content of the metal ion in the solution containing the metal ion is 0.0001 to 1.0 mol/L.

[11] A method according to [10], wherein the solution containing the metal ion further contains a complexing agent, and a ratio of a content of the complexing agent to the content of the metal ion is 1 to 100.

[12] A method according to any one of [1] to [11], wherein the metal ion in the solution is an ion of copper, nickel, cobalt, or tin.

[13] A method according to any one of [1] to [12], wherein in the depositing step, a photosensitive film having a silver salt emulsion layer containing a silver salt is formed on the base material, and is exposed and developed to form a metallic silver portion.

[14] A method according to any one of [1] to [12], wherein in the depositing step, a paste or an ink containing the conductive fine particle is printed on the base material.

[15] A method according to any one of [1] to [12], wherein in the depositing step, a photosensitive resin layer containing the conductive fine particle is formed on the base material, and is irradiated with a light and developed using a photomask.

[16] An apparatus according to the present invention for subjecting a base material having a conductive fine particle to a plating treatment to form a conductive layer, thereby producing a conductive material, comprising an electrifying unit and an electroless plating unit, wherein the electrifying unit comprises a feed roller for feeding electricity to the conductive fine particle in contact therewith, and an electrifying bath for electrifying the conductive fine particle in a solution containing a metal ion, disposed downstream of the feed roller in the direction of conveying the base material, and the electroless plating unit is disposed downstream of the electrifying unit, and is used for subjecting the conductive fine particle to an electroless plating treatment to deposit a metal thereon.

As described above, by using the conductive material producing method and the conductive material producing apparatus of the present invention, the continuous plated metal layer can be formed on the developed silver or the patterned conductive fine particle deposited by printing, etc. to increase a plating rate in the production of the conductive material. Thus, the conductive material, which has the conductive metal layer of a patterned fine wire on the base material and can be suitably used in electromagnetic shielding films and transparent electrodes, can be highly efficiently produced in the present invention.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1A:
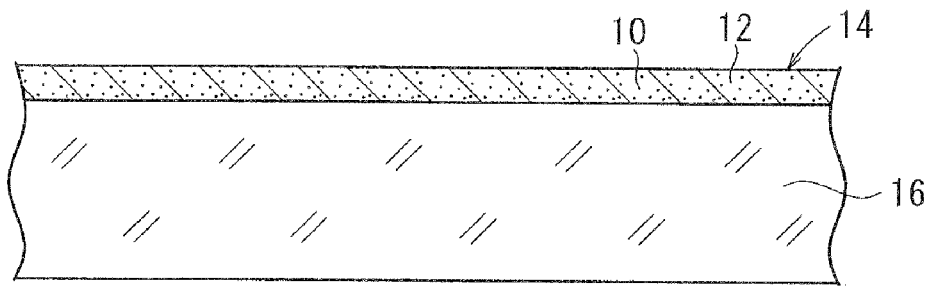
FIGS. 1A to 1D are views showing the step of depositing conductive fine particles on a base material with a process using a photosensitive silver halide material.

The conductive material producing method and the conductive material producing apparatus of the present invention will be described in detail below.

It should be noted that, in the present invention, a numeric range of "A to B" includes both the numeric values A and B as the lower limit and upper limit values.

The conductive material producing method of the present invention comprises: (1) the step of depositing a conductive fine particle on a surface of a base material; (2) the step of electrifying the base material in a solution containing a metal ion, using the conductive fine particle as a cathode; and (3) the step of subjecting the base material to an electroless plating treatment to deposit a metal on the conductive fine particle.

<Step of Depositing Conductive Fine Particle on Base Material Surface>

In the present invention, the method of depositing the conductive fine particle on the base material surface is not particularly limited. It is preferred that the conductive fine particles are deposited in a pattern on the base material surface. For example, the conductive fine particles can be preferably deposited by the following processes.

[1] Process Using Photosensitive Silver Halide Material

In this process, a photosensitive silver halide layer is formed, exposed, and developed on the base material surface, whereby the conductive fine particles of developed silver are deposited on the surface.

[2] Printing Process

In this process, a paste or an ink containing the conductive fine particles is printed on the base material.

[3] Photoresist Process

In this process, a photosensitive resin layer containing the conductive fine particles is formed on the base material, and an unnecessary portion is etched and removed by a photoresist technique.

<Process Using Photosensitive Silver Halide Material>

The producing method containing the process using the photosensitive silver halide material for depositing the conductive fine particles on the base material surface (which may be referred to as the producing method of the present invention hereinafter) will be described in detail below.

Preferred examples of the process using the photosensitive silver halide material include the following two processes, different in the types of the photosensitive material and development treatment.

(1) Process comprising chemical development of photosensitive silver halide material free of physical development nuclei for forming metallic silver portion thereon This process is described in Japanese Laid-Open Patent Publication Nos. 2004-221564, 2006-228469, 2006-332459, 2007-129205, and 2007-095331, etc.

In this process, since the photosensitive material is free of physical development nuclei that stain a portion other than the conductive layer, the conductive material can be produced with a high light transmittance. Since the contents of the photosensitive material and the development treatment are simple, the process is productive. Further, because the developed silver is formed without diffusion transfer processes, the conductive layer can be finely formed. However, the developed silver cannot be formed with a high density because of a binder in the photosensitive material, and the developed silver layer has a lower conductivity as compared with diffusion transfer processes.

Control of the silver/binder ratio or swelling ratio of the photosensitive material, a consolidation treatment, a binder elution treatment, etc. are proposed to solve the problem.

(2) Process comprising solution physical development of photosensitive silver halide material containing physical development nuclei for forming developed silver on physical development nuclei by diffusion transfer This process is described in Japanese Patent Publication No. 42-23745, International Patent Publication Nos. WO 01/51276 and WO 2004/7810, etc. In this process, silver ions dissolved by the solution physical development can be deposited on the physical development nuclei to increase the silver density, whereby the conductivity can be easily increased. However, this process is disadvantageous in that the wire width is often increased due to diffusion of the silver ions, the transmittance is reduced due to the physical development nuclei disposed in a portion other than the conductive layer, and the contents of the photosensitive material and the development treatment are complicated.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes*, 4th ed.", Macmillian, 1977. A liquid development treatment is generally used in the present invention, and also a thermal development treatment can be utilized. For example, techniques described in Japanese Laid-Open Patent Publication Nos. 2004-184693, 2004-334077, and 2005-010752, and Japanese Patent Application Nos. 2004-244080 and 2004-085655 can be used.

In the present invention, the components of the photosensitive silver halide material, the exposure treatment, and the development treatment may be selected from those described in the above patent publications and known ones. They are particularly preferably selected from those described in the following patent publications.

(a) Photosensitive Silver Halide Material

Japanese Laid-Open Patent Publication Nos. 2006-228469, 2006-332459, and 2006-352073, and Japanese Patent Application No. 2006-24723.

(b) Exposure Treatment

Japanese Laid-Open Patent Publication Nos. 2006-261315 and 2007-72171.

(c) Development Treatment

Japanese Laid-Open Patent Publication Nos. 2006-228473, 2006-269795, 2006-267635, 2006-267627, and 2006-324203.

The developed photosensitive material may be preferably subjected to a film hardening treatment described in Japanese Patent Application No. 2005-379199, a smoothing treatment described in Japanese Laid-Open Patent Publication No. 2007-129205, an aqueous electrolyte solution treatment described in Japanese Patent Application No. 2006-336090, a hot water or steam treatment described in Japanese Patent Application No. 2007-93021, etc.

An example of the step of depositing the conductive fine particles on the base material surface with the method using the photosensitive silver halide material will be described below with reference to FIGS. 1A to 1D.

First, as shown in FIG. 1A, the base material such as a transparent support 16 is coated with a photosensitive silver salt layer 14, which is prepared by mixing a silver halide 10 (e.g., silver bromide particles, silver chlorobromide particles, silver iodobromide particles) with a gelatin 12. Though the silver halide 10 is exaggeratingly shown as particles in FIGS. 1A to 1C to facilitate understanding, the size, concentration, etc. of the silver halide 10 are not limited to the drawings.

Figure 1B:
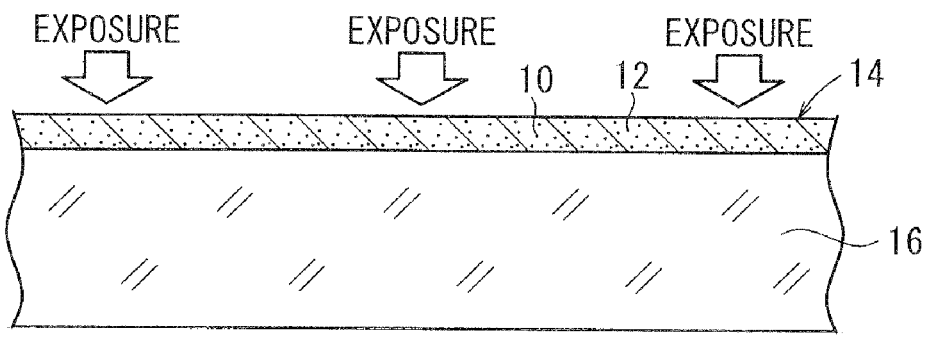

Then, as shown in FIG. 1B, the photosensitive silver salt layer 14 is subjected to an exposure treatment for forming a mesh pattern, etc. When an optical energy is applied to the silver halide 10, a minute silver nucleus (a latent image), invisible to the naked eye, is generated.

Figure 1C:
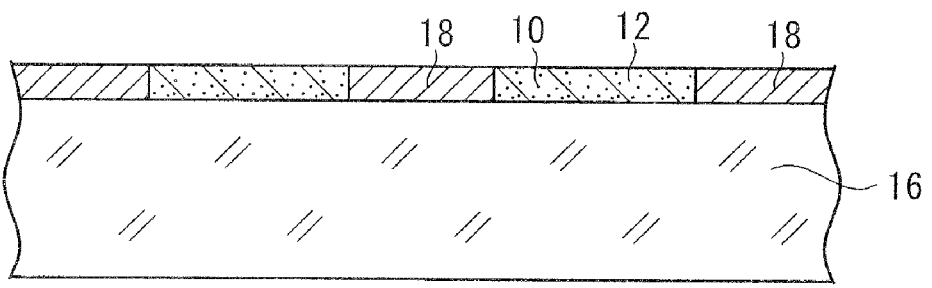

As shown in FIG. 1C, a development treatment is carried out to convert the latent image to an image visible to the naked eye. Specifically, the photosensitive silver salt layer 14 having the latent image is developed using a developer, which is an alkaline or acidic solution, generally an alkaline solution. In the development treatment, using the latent image silver nucleus as a catalyst core, a silver ion from the silver halide or the developer is reduced to metallic silver by a reducing agent, called a developing agent, in the developer. As a result, the latent image silver nucleus is grown to form a visible silver image (a developed silver 18).

Figure 1D:
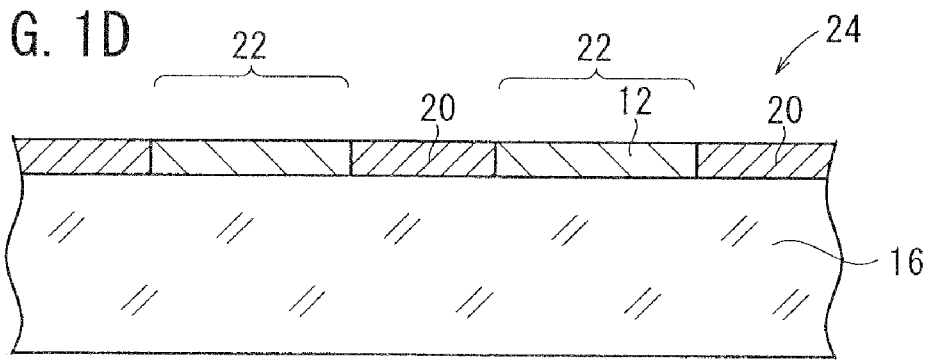

The photosensitive silver halide 10 remains in the photosensitive silver salt layer 14 after the development treatment. As shown in FIG. 1D, the residual silver halide 10 is removed by a fixation treatment using a fixer, which is an acidic or alkaline solution, generally an acidic solution.

After the fixation treatment, fine metal particle portions (metallic silver portions 20) are disposed in exposed areas, and only the gelatin 12 remains in unexposed areas as light transmittable portions 22. Thus, a combination of the metallic silver portions 20 and the light transmittable portions 22 is formed on the transparent support 16. At this stage, the base material to be plated 24, having the metallic silver portions 20 (the conductive fine particles), is obtained.

In a case where silver bromide is used as the silver halide 10 and a thiosulfate salt is used in the fixation treatment, a reaction represented by the following formula proceeds in the fixation treatment.

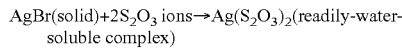

AgBr(solid)+2S$_2$O$_3$ ions→Ag(S$_2$O$_3$)$_2$(readily-water-soluble complex)

Two thiosulfate S$_2$O$_3$ ions and a silver ion in the gelatin 12 (from AgBr) are reacted to generate a silver thiosulfate complex. The silver thiosulfate complex has high water solubility, and thereby is eluted from the gelatin 12. As a result, the developed silver 18 is fixed and remains as the metallic silver portion 20.

Thus, the latent image is reacted with the reducing agent to deposit the developed silver 18 in the development treatment, and the residual silver halide 10, not converted to the developed silver 18, is eluted into water in the fixation treatment. The treatments are described in detail in T. H. James, "*The Theory of the Photographic Process,* 4th ed.", Macmillian Publishing Co., Inc., NY, Chapter 15, pp. 438-442, 1977.

An alkaline solution is generally used in the development treatment. Therefore, when the procedure proceeds from the development treatment to the fixation treatment, the alkaline solution used in the development treatment may be mixed into the fixer (generally an acidic solution), whereby the activity of the fixer may be disadvantageously changed in the fixation treatment. Further, the developer may remain on the film after removing the film from the development bath, whereby an undesired development reaction may be accelerated by the developer. Thus, it is preferred that the photosensitive silver salt layer 14 is neutralized or acidified by a quencher such as an acetic acid solution after the development treatment before the fixation treatment.

The difference between the above mentioned process using the silver halide emulsion layer 14 (a silver salt photography technology) and the process using a photoresist (a resist technology) will be described below.

In the resist technology, a photopolymerization initiator absorbs a light in an exposure treatment to initiate a reaction, a photoresist film (a resin) per se undergoes a polymerization reaction to increase or decrease the solubility in a developer, and the resin in an exposed area or an unexposed area is removed in a development treatment. The developer used in the resist technology may be an alkaline solution free of reducing agents, in which an unreacted resin component can be dissolved. On the other hand, as described above, in the silver salt photography technology according to the present invention, the minute silver nucleus, the so-called latent image, is formed from silver ion and photoelectron generated in the exposed silver halide 10 in the exposure treatment. The latent image silver nucleus is grown to form the visible silver image in the development treatment using the developer, which must contain the reducing agent (the developing agent). Thus, the resist technology and the silver salt photography technology are greatly different in the reactions in the exposure and development treatments.

In the development treatment of the resist technology, the unpolymerized resin portion in the exposed or unexposed area is removed. On the other hand, in the development treatment of the silver salt photography technology using the latent image as the catalyst core, the reduction reaction is conducted by the reducing agent (the developing agent) contained in the developer, and the developed silver 18 is grown into a visible size. The gelatin 12 in the unexposed area is not removed in the silver salt photography technology. Thus, the resist technology and the silver salt photography technology are greatly different also in the reactions in the development treatments.

The silver halide 10 contained in the gelatin 12 in the unexposed area is eluted in the following fixation treatment, and the gelatin 12 is not removed as shown in FIG. 1D.

The main reaction component (the photosensitive component) is the silver halide 10 in the silver salt photography technology, while it is the photopolymerization initiator in the resist technology. Further, in the development treatment, the binder (the gelatin 12) remains in the silver salt photography technology as shown in FIG. 1D, while it is removed in the resist technology. The resist technology and the silver salt photography technology are greatly different in these points.

<Printing Process>

The producing method containing the process of printing the paste or ink containing the conductive fine particles for depositing the conductive fine particles on the base material surface (which may be referred to as the producing method of the present invention hereinafter) will be described in detail below.

Figure 2:
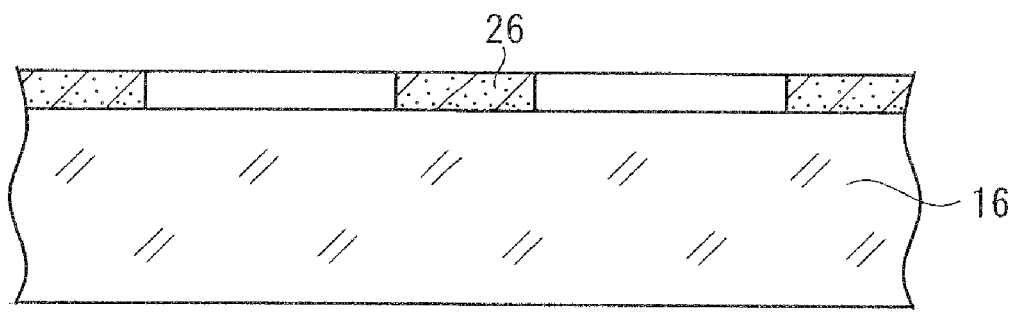
FIG. 2 is a view showing the step of depositing conductive fine particles on a base material by using a printing process.

In an example of the step of depositing the conductive fine particles on the base material surface by using the printing process, as shown in FIG. 2, a paste 26 containing the conductive fine particles is screen-printed on a surface of the transparent support 16.

A known printing method such as a gravure, offset, typographic, screen, flexo, or ink-jet printing method may be used in the present invention. Preferred examples of the known printing methods include screen printing methods described in Japanese Laid-Open Patent Publication Nos. 11-170420 and 2003-109435, offset printing methods described in Japanese Laid-Open Patent Publication Nos. 2000-196285 and 2001-358496, ink-jet methods described in Japanese Laid-Open Patent Publication No. 2003-318593, and flexo printing methods described in Japanese Laid-Open Patent Publication No. 2004-40033.

The base material may be subjected to a surface treatment or covered with an anchor coat layer. Examples of effective surface treatments include primer coating treatments, plasma treatments, and corona discharge treatments. After the treatment, the critical surface tension of the base material is preferably $3.5\times10^{-4}$ N/cm or more, more preferably $4.0\times10^{-4}$ N/cm or more.

The paste or ink used in the printing process contains the conductive fine particles for forming a conductive pattern by printing, and preferably further contains a solvent, a binder, or a dispersing agent for dispersing the particles.

In the present invention, the material of the conductive fine particle is not particularly limited, and is preferably a metal, a metal oxide, a carbon black, or a mixture thereof. Specifically, preferred examples of the materials include metals such as silver, copper, palladium, gold, nickel, aluminum, tungsten, iron, tin, cobalt, zinc, chromium, vanadium, titanium, and alloys thereof, and metal oxides such as zinc oxide, tin oxide, titanium oxide, silver oxide, vanadium pentoxide, molybdenum trioxide, barium oxide, tungsten trioxide, alumina, Sb-doped tin oxide (ATO), In-doped tin oxide (ITO), tin oxide-doped indium oxide (ITO), Al-doped zinc oxide, and Nb-doped titanium oxide.

Though metals other than noble metals are known to have low electroless plating activity, such a metal or an oxide thereof can be suitably used for the conductive fine particle in the present invention. Because palladium has a high electroless plating activity intrinsically, the advantageous effects of the present invention are less significant when the noble metal is used for the conductive fine particle. Thus, it is preferred that the conductive fine particle is free of palladium. The particle size of the fine particle is not particularly limited. When the particle size is excessively large, the wire width or outline of the conductive layer is deteriorated. Thus, the spherical equivalent diameter of the fine particle, which is a diameter of a spherical particle having the same volume as the fine particle, is preferably 0.01 to 2 μm. The shape of the fine particle is not particularly limited. When the fine particle has a plate shape or an anisotropic shape such as a needle shape, a high conductivity can be achieved by using only a small amount of the fine particle.

Preferred examples of the binders usable in the paste or ink according to the present invention include gelatins and derivatives thereof, polyvinyl alcohols (PVA), polyvinyl pyrolidones (PVP), polysaccharides such as starches, cellulose derivatives such as carboxymethyl celluloses and hydroxyethyl celluloses, and hydrophilic binders such as polyethylene oxides, polyvinylamines, chitosans, polylysines, polyacrylic acids, polyalginic acids, and polyhyaluronic acids. These binders show a neutral, anionic, or cationic property due to iconicity of a functional group.

Examples of the binders usable in the present invention further include resins such as polyester resins, polyvinyl butyral resins, ethylcellulose resins, (meth)acrylic resins, polyethylene resins, polystyrene resins, polyamide resins, polyurethane resins, polyester-melamine resins, melamine resins, epoxy-melamine resins, phenol resins, epoxy resins, amino resins, polyimide resins, and (meth)acrylic resins. Two or more of these resins may be copolymerized or blended if necessary.

The binder may be colorless or colored. When a colored binder is used in a display material, light reflection can be reduced to improve the visibility. The paste or ink generally contains the binder, and it does not have to contain the binder in a case where, without the binder, the conductive fine particles can be satisfactorily dispersed and can be brought into sufficient contact with the base material after the printing.

Preferred examples of the solvents used in the paste or ink according to the present invention include water, alcohols, glycols, ketones, and esters. Specific examples of the solvents include water; alcohols such as hexanol, octanol, nonanol, decanol, undecanol, dodecanol, tridecanol, tetradecanol, pentadecanoyl, stearyl alcohol, seryl alcohol, cyclohexanol, and terpineol; alkyl ethers such as ethylene glycol monobutyl ether (butyl cellosolve), ethylene glycol monophenyl ether, diethylene glycol, diethylene glycol monobutyl ether (butyl carbitol), cellosolve acetate, butyl cellosolve acetate, carbitol acetate, and butyl carbitol acetate; acetone; methyl ethyl ketone; methyl acetate; and ethyl acetate. The solvent may be appropriately selected depending on printing properties, handling properties, etc.

When a higher alcohol is used as the solvent, the drying property and the fluidity of the ink may be deteriorated. Thus, the higher alcohol may be used in combination with a solvent having a more excellent drying property such as butyl carbitol, butyl cellosolve, ethyl carbitol, butyl cellosolve acetate, or butyl carbitol acetate. The amount of the solvent may be selected depending on the viscosity of the ink or paste. The solvent amount per 100 parts by mass of the binder is generally 100 to 500 parts by mass, preferably 100 to 300 parts by mass, in view of the amount of the metal particles.

The viscosity of the ink or paste used in the present invention may be appropriately controlled depending on the printing method and the solvent, and is preferably 5 to 20,000 mPa·s.

The ink or paste used in the present invention may contain a surfactant, a dispersing agent, a thickener, a leveling agent, a crosslinking agent, etc. in addition to the conductive fine particles, the binder, and the solvent.

<Photoresist Process>

The conductive fine particles may be deposited on the base material surface by the steps of forming the photosensitive resin layer containing the conductive fine particles on the base material, and etching and removing the unnecessary portion using a photoresist technique, as described in Japanese Laid-Open Patent Publication No. 2004-172554, etc.

Figure 3A:
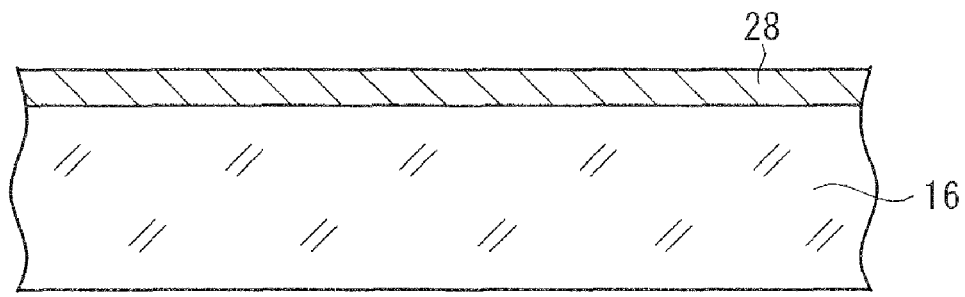
FIGS. 3A to 3C are views showing the step of depositing conductive fine particles on a base material by using a photoresist process.
Figure 3B:
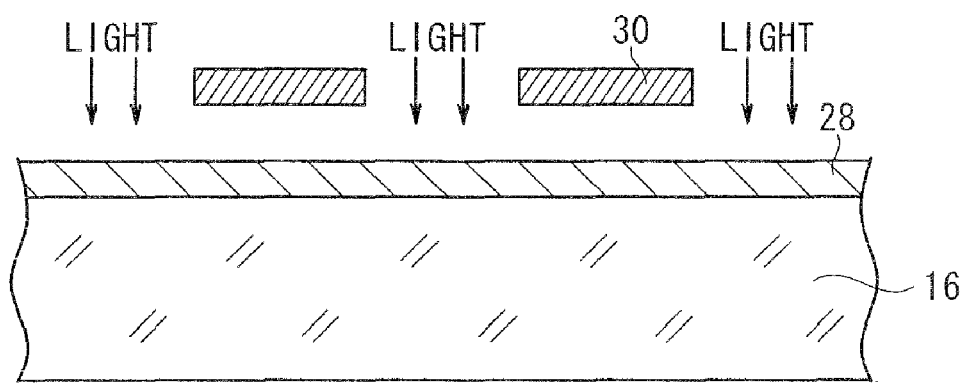

Thus, as shown in FIG. 3A, first a photosensitive resin layer 28 containing conductive fine particles is formed on the transparent support 16 by a coating method, etc. Then, as shown in FIG. 3B, a photomask 30 having a mask pattern is placed on the photosensitive resin layer 28, and the photosensitive resin layer 28 is irradiated with a light (e.g. an ultraviolet light) through the photomask 30.

Figure 3C:
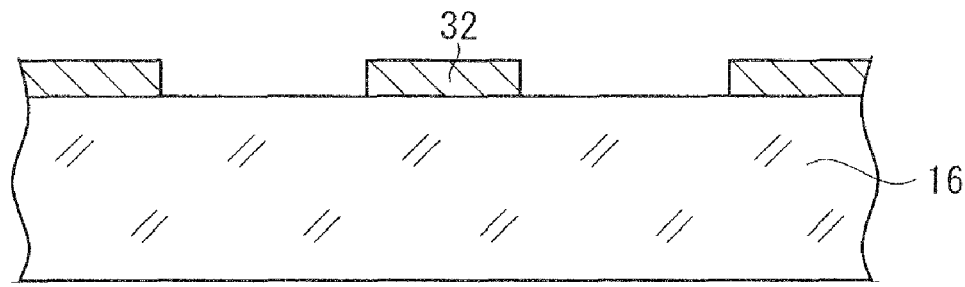

As shown in FIG. 3C, unexposed areas of the photosensitive resin layer 28, which are not irradiated with the light, is removed in a development treatment, whereby a conductive layer 32 having a pattern corresponding to the mask pattern is formed on the transparent support 16.

The base material for the processes will be described below. A support such as a plastic film, a plastic plate, or a glass plate is preferably used as the base material in the present invention.

Examples of materials for the plastic film and plastic plate include polyesters such as polyethylene terephthalates (PET) and polyethylene naphthalates; polyolefins such as polyethylenes (PE), polypropylenes (PP), polystyrenes, and EVA; vinyl resins such as polyvinyl chlorides and polyvinylidene chlorides; polyether ether ketones (PEEK); polysulfones (PSF); polyether sulfones (PES); polycarbonates (PC); polyamides; polyimides; acrylic resins; and triacetyl celluloses (TAC).

In the present invention, it is preferred that the plastic film is a polyethylene terephthalate film from the viewpoints of transparency, heat resistance, handling, and cost.

Electromagnetic shielding materials for displays have to be transparent. Thus, in a case where the conductive material is used for the electromagnetic shielding material, the support preferably has high transparency. In this case, the total visible light transmittance of the plastic film or plate is preferably 70% to 100%, more preferably 85% to 100%, particularly preferably 90% to 100%. The plastic film and plastic plate may be colored as long as they do not interfere with the advantageous effects of the present invention.

In the present invention, the plastic film and plastic plate may have a monolayer structure or a multilayer structure containing 2 or more layers.

In the present invention, the glass plate used as the support is not particularly limited. In a case where the glass plate is used in the electromagnetic shielding film for a display, the glass plate is preferably composed of a reinforced glass having a reinforcing layer on the surface. The reinforced glass can be prevented from breakage more easily as compared with unreinforced glasses. Further, a reinforced glass obtained by air cooling is preferred from the safety viewpoint. If broken, such a reinforced glass is divided into significantly small fragments having unsharp edges.

The transparent support is preferably composed of a flexible material. The transparent support is preferably a film having a width of 2 cm or more, a length of 3 m or more, and a thickness of 200 μm or less, and more preferably a film having a width of 20 cm or more, a length of 30 m or more, and a thickness of 150 μm or less.

In the present invention, the base material is particularly preferably the plastic film support. It is more preferred that the support is subjected to a surface treatment such as a corona discharge treatment, a glow discharge treatment, a UV (ultraviolet) exposure treatment, a flame treatment, or a saponification treatment. It is further preferred that an adhesion promoting primer layer containing a polymer such as an acrylic polymer, a urethane polymer, a polyester, a butadiene polymer, or a vinylidene chloride polymer is formed on a surface of the support.

<Step of Electrifying in Solution Containing Metal Ion, Using Conductive Fine Particle as Cathode>

In the conductive material producing method of the present invention, after depositing the conductive fine particles on the base material surface, the base material is electrified in the solution containing a metal ion (which may be referred to as the metal ion-containing activation solution hereinafter) using the conductive fine particles as a cathode. This step is carried out with the purpose of increasing the electroless plating activity in the following electroless plating treatment of the conductive fine particles.

The conductive fine particles, deposited on the base material by the above process, are generally insufficient in conductivity for use in a light transmittable, electromagnetic shielding material, etc. due to the contact resistance between the particles, the electric resistance of the dispersion binder, the insufficient amount of the deposited particles, etc. Therefore, an additional metal layer is stacked on the fine particles by an electroplating or electroless plating treatment to increase the conductivity. However, as described above, the electroplating treatment has the disadvantage of low productivity due to the insufficient conductivity of the base material.

Also the electroless plating treatment has a disadvantage. Thus, the developed silver formed on the photosensitive silver halide material, etc. has an insufficient electroless plating activity. Though many techniques for improving the insufficient activity have been tested, a satisfactory technique has not been developed as described above. Furthermore, the conductive fine particles deposited by the printing process, etc. are coated with the dispersion binder to reduce the electroless plating activity. In fact, such particles generally do not have electroless plating activity, other than particular particles such as palladium particles.

Under such circumstances where conventional techniques have problems in the electroplating and electroless plating treatments for stacking the additional metal layer, the inventors has found that the electroless plating activity of the conductive fine particles can be greatly improved by electrifying the material in the solution containing a metal ion (the metal ion-containing activation solution) using the conductive fine particles as a cathode. The present invention has been accomplished based on this finding. The electrifying step is carried out with the purpose of applying a trace amount of a catalyst metal onto the conductive fine particles to increase the electroless plating activity. The electrifying step of the present invention requires only an extremely smaller amount of current as compared with the electroplating treatment for stacking the metal layer. Therefore, the method of the present invention can be used even when the conductivity of the base material is insufficient for the electroplating treatment. In other words, the method of the present invention is particularly effective when the base material has an insufficient conductivity and thereby is not suitable for the electroplating. Thus, the advantageous effects of the present invention are less significant when the base material has a sufficient conductivity and thereby is suitable for the electroplating. Specifically, in the present invention, after the step of depositing the conductive fine particles, the surface resistance of the base material is preferably 5 to 10,000 Ω/sq, more preferably 10 to 1,000 Ω/sq.

[Electrification Method]

In the electrifying step of the present invention, electricity is applied to the base material having the conductive fine particles while conveying the base material in a bath filled with the metal ion-containing activation solution. The electricity may be preferably applied by using a roller-shaped metal electrode placed out of the bath. A counter positive electrode is placed in the activation solution in the bath, and a portion of the conductive fine particles, immersed in the activation solution, acts as a negative electrode. Even when the base material has an insufficient conductivity, by carrying out the conveyance and the electricity application simultaneously in this manner, the current can be prevented from being concentrated in the vicinity of the electrode, and the ununiformity can be reduced. Thus, in this manner, even when the base material has an insufficient conductivity, a large area, and a sheet, web, or roll shape, the electricity can be uniformly applied thereto.

The preferred electrifying current depends on the conductivity of the conductive fine particles. When the current is too low, the electroless plating activity cannot be obtained. When the current is too high, the conductive fine particle wire may be broken. Thus, the current is preferably 0.01 to 10 A/dm$^2$, more preferably 0.05 to 5 A/dm$^2$, particularly preferably 0.1 to 1 A/dm$^2$.

When the electrifying time is too short, the electroless plating activity cannot be obtained. When the electrifying time is too long, particularly the conductive fine particles in the vicinity of the electrode are disadvantageously precedes electroplating, resulting in nonuniform metal deposition. Thus, the electrifying time is preferably 0.01 to 60 seconds, more preferably 0.1 to 30 seconds.

The positive electrode, used as a counter electrode in the electrification, may be appropriately selected from soluble positive electrodes and insoluble positive electrodes depending on the metal ion in the activation solution. The soluble positive electrode is preferably composed of a metal of the same type as the metal ion. The insoluble positive electrode is preferably composed of carbon, platinum, platinum-coated titanium, etc. Specifically, when the metal ion is a copper ion, the material of the soluble positive electrode is preferably phosphorus-containing copper, electrolytic copper, oxygen-free copper, etc., particularly preferably phosphorus-containing copper. When the metal ion is a nickel ion, the material of the soluble positive electrode is particularly preferably electrolytic nickel, and also sulfur-containing nickel, carbonized nickel, depolarized nickel, etc. can be preferably used. The positive electrode may have a plate, bar, pellet, ball, or chip shape, and may be put in a titanium basket, etc. An anode bag may be used to prevent anode slime.

Though the reason why the conductive material reduces its resistance value by electrification has not yet defined, it is assumed that the factor is activation of the low-active components such as metal oxide deposited on the surfaces of the conductive particles. Plating progresses efficiently by performing the plating step immediately after the electrifying step.

[Composition of Metal Ion-Containing Activation Solution]

The composition of the metal ion-containing activation solution used in the present invention will be described below. In the present invention, the term "metal" means a metal other than alkaline metals and alkaline earth metals unless otherwise noted. Thus, a solution containing an ion of an alkaline metal (such as sodium or potassium) or an alkaline earth metal (such as calcium or strontium) is not used as the metal ion-containing activation solution of the present invention. The activation solution of the present invention may contain a metal ion suitable for the electroless plating step. Specifically, the activation solution preferably contains an ion of iron, cobalt, nickel, copper, ruthenium, rhodium, palladium, silver, iridium, platinum, gold, tin, zinc, aluminum, magnesium, titanium, or chromium, or a mixture thereof. Ions of bismuth, antimony, arsenic, manganese, lead, and the like are not suitable for the activation solution because they inhibit the electroless plating. The metal ion in the activation solution is preferably an ion of iron, nickel, copper, silver, cobalt, zinc, or tin, more preferably an ion of iron, nickel, copper, cobalt, or tin, most preferably a divalent copper ion.

The metal ion used in the metal ion-containing activation solution may be equal to or different from a metal ion used in the electroless plating step. The metal ion in the activation solution may be appropriately selected from ions that do not disturb the electroless plating activity and do not form a displacement plating layer in the electroless plating step. It is preferred that the metal ion in the activation solution is equal to that used in the electroless plating step, because the displacement plating is not caused.

The amount of the metal ion in the solution to be electrified is significantly smaller than that in the normal electroplating bath. The amount of the metal plated in the electrifying step is also as minute as $1/10$ times or less the amount of the metal plated in the following electroless plating step. It may be $1/100$ times or smaller. The lower limit of the amount of the metal plated in the electrifying step may be $1/10000$ or $1/1000$ times the amount of the metal plated in the following electroless plating step. That is, the electrifying step of the present invention is different from the normal electroplating.

Preferred examples of components other than the metal ion in the metal ion-containing activation solution include complexing agents, pH regulators such as acids and alkalis, pH buffers, surfactants, antioxidants such as hydroquinone, tiron, and ascorbic acid, and salts such as alkaline metal salts, quarternary alkyl ammonium salts, perchlorate salts, borate salts, and thiocyanate salt. The activation solution may further contain an amino acid such as glycine, polyethylene glycol, a nitrogen-containing additive such as 2,2'-bipyridyl or phenanthroline, a sulfur-containing additive such as a thiourea compound, a thiazole compound, a mercapto compound, or a disulfide compound, etc.

Preferred complexing agents used in the present invention include inorganic complexing agents such as tetrapolyphosphoric acid, hexametaphosphoric acid, and pyrophosphoric acid, and organic complexing agents such as organic carboxylic acids, aminopolycarboxylic acids, organic phosphonic acids, aminophosphonic acids, and organic phosphonocarboxylic acids.

Examples of the organic carboxylic acids include acrylic acid, oxalic acid, malonic acid, succinic acid, glutaric acid, adipic acid, pimelic acid, azelaic acid, sebacic acid, nonanedicarboxylic acid, decanedicarboxylic acid, undecanedicarboxylic acid, maleic acid, itaconic acid, malic acid, citric acid, and tartaric acid.

Examples of the aminopolycarboxylic acids include iminodiacetic acid, nitrilotriacetic acid, nitrilotripropionic acid, ethylenediaminemonohydroxyethyltriacetic acid, ethylenediaminetetraacetic acid, glycol ether tetraacetic acid, 1,2-diaminopropanetetraacetic acid, diethylenetriaminepentaacetic acid, triethylenetetraminehexaacetic acid, 1,3-diamino-2-propanoltetraacetic acid, glycol ether diaminetetraacetic acid, and compounds described in Japanese Laid-Open Patent Publication Nos. 52-25632, 55-67747, and 57-102624, and Japanese Patent Publication No. 53-40900, etc.

Examples of the organic phosphonic acids include hydroxyalkylidene diphosphonic acids described in U.S. Pat. Nos. 3,214,454 and 3,794,591, and German Patent Publication No. 2227639, etc., and compounds described in *Research Disclosure*, Vol. 181, Item 18170 (May issue, 1979).

Examples of the aminophosphonic acids include aminotris (methylenephosphonic acid), ethylenediaminetetramethylenephosphonic acid, aminotrimethylenephosphonic acid, and compounds described in *Research Disclosure*, Vol. 181, Item 18170, Japanese Laid-Open Patent Publication Nos. 57-208554, 54-61125, 55-29883, and 56-97347, etc.

Examples of the organic phosphonocarboxylic acids include compounds described in Japanese Laid-Open Patent Publication Nos. 52-102726, 53-42730, 54-121127, 55-4024, 55-4025, 55-126241, 55-65955, and 55-65956, and Research Disclosure, Vol. 181, Item 18170, etc. The chelating agents may be used in the state of an alkali metal salt or an ammonium salt.

In the present invention, the complexing agent is particularly preferably an ethylenediaminetetraacetate salt, a triethanolamine salt, a tartrate salt, an acetate salt, a citrate salt, or a pyrophosphate salt. In a case where the metal ion in the activation solution is equal to that used in the electroless plating step, it is preferred that also the complexing agent in the activation solution is equal to that used in the electroless plating step.

Though the complexing agent is not essential to the present invention, it is preferred that the complexing agent is used to expand a region to be activated. Since the conductive fine particles are insufficient in conductivity, only a part of the particles in the vicinity of the electrode is activated by the electrification. Thus, to activate a wider region, the electricity has to be applied while conveying the base material as described above. In the case of using the complexing agent, also a part more distant from the electrode can be activated. In this case, the base material can be conveyed at a higher rate in the electrification to improve the productivity, and the uniformity of the plating can be improved.

The complexing agent is not essential to the present invention, and the content thereof can be determined arbitrarily.

Preferably, the content is 0.0001 to 10 mol/L, more preferably 0.001 to 2.0 mol/L, particularly preferably 0.001 to 1.0 mol/L.

The preferred content of the metal ion in the metal ion-containing activation solution depends on the conductivity of the conductive fine particles. When the content of the metal ion is too low, the electroless plating activity cannot be obtained. When the content is too high, the electroplating proceeds only in the vicinity of the electrode, resulting in increased ununiformity. The metal ion content is 0.0001 to 10 mol, per 1 L. The upper limit of the metal ion content is preferably 2 mol, more preferably 1 mol, per 1 L. On the other hand, the lower limit of the metal ion content is preferably 0.0002 mol, more preferably 0.0004 mol, per 1 L. The mole ratio of the complexing agent to the metal ion is preferably 1 to 100, more preferably 2 to 10.

The step of electrification in the metal ion-containing activation solution using the conductive fine particles as the cathode according to the present invention is greatly different from conventional electroplating processes in preferred metal ion concentration, current value, and electrifying time. In the present invention, this step is carried out with the purpose of increasing the electroless plating activity as described above, and the metal is deposited from the metal ion-containing activation solution on the conductive fine particles only in a trace amount. Thus, as compared with conventional electroplating solutions, the activation solution according to the present invention is used under a lower metal ion concentration, a smaller current amount, and a shorter electrifying time.

The method of the present invention is greatly different also from the above described technique for increasing electroless plating rate, which contains applying a current or a negative electric potential using a material to be plated as a negative electrode in an electroless plating solution. The metal ion-containing activation solution used in the electrification in the present invention does not need to have electroless plating activity, and preferably does not have electroless plating activity in view of preventing metal deposition on the positive electrode. It is preferred that the metal ion-containing activation solution with no electroless plating activity is free of reducing agents, or contains a reducing agent at a controlled pH, at which the reducing agent is nonfunctional.

<Step of Depositing Metal on Conductive Fine Particle by Electroless Plating>

(Electroless Plating Treatment)

In the present invention, the electroless plating treatment may be carried out using a known electroless plating technique. For example, copper, nickel, chromium, zinc, tin, gold, platinum, or silver may be used as an electroless plating metal in the treatment. It is preferred that copper is used as the metal from the viewpoints of conductivity and plating stability.

The electroless plating time is preferably 15 seconds to 30 minutes, more preferably 30 seconds to 15 minutes, further preferably 1 to 10 minutes. When the electroless plating time is more than 30 minutes, the transparency of a light transmittable portion is remarkably reduced. The reduction seems to be caused such that a gelatin film is immersed in a high alkaline bath for a long time and thereby deteriorated. When the electroless plating time is less than 30 seconds, the resultant plated layer has remarkably uneven thickness.

The electroless plating temperature is preferably 10° C. to 80° C., more preferably 15° C. to 70° C., further preferably 18° C. to 65° C.

In the electroless copper plating treatment, a copper electroless plating solution for the treatment is preferably aerated continuously or stepwise. The dissolved oxygen amount of the solution is preferably maintained at 2 to 4 ppm by the aeration. An impurity or precipitate in the solution is preferably removed by filtration.

The electroless copper plating solution will be described below.

Electroless Copper Plating Solution

The electroless copper plating solution used in the present invention may be known one containing a copper ion, a reducing agent, a complexing agent, a stabilizer, a pH regulator, etc.

Copper sulfate or a hydrate thereof, copper chloride, or copper oxide is preferably used as a metal salt for supplying the copper ion. Copper sulfate pentahydrate is particularly preferred from the viewpoint of cost. The reducing agent is preferably formaldehyde, glyoxylic acid, hydrazine, dimethylamine borane, a phosphinate salt, a tetrahydroborate salt, etc., particularly preferably formaldehyde. The complexing agent is preferably EDTA, TIPA, triethanolamine, a tartrate salt, etc., particularly preferably EDTA or triethanolamine. The stabilizer is preferably yellow prussiate of potash, 2,2'-bipyridyl, thiourea, a cyanide, o-phenanthroline, Neocuproin, etc. The electroless copper plating solution preferably contains an additive for stabilizing the bath or improving smoothness of a plated film, such as polyethylene glycol, a thiourea compound, or an amino acid (glycine, adenine, etc.) Further, the electroless copper plating solution preferably contains a counter salt of the copper ion source (e.g. sodium sulfate in the case of using copper sulfate) or an oxide of the reducing agent (e.g. sodium formate in the case of using formaldehyde) to maintain the uniform liquid composition.

The amount of the bath stabilizer is preferably $1 \times 10^{-9}$ to $1 \times 10^{-4}$ mol/L, more preferably $1 \times 10^{-8}$ to $1 \times 10^{-6}$ mol/L. The concentration of the copper ion is preferably 0.001 to 0.3 mol/L, more preferably 0.005 to 0.1 mol/L, further preferably 0.01 to 0.1 mol/L. The concentration of the complexing agent is preferably 0.5 to 10 times, more preferably 0.8 to 4 times, the copper ion concentration, by mol/L. The concentration of the reducing agent is preferably 0.001 to 1 mol/L, more preferably 0.01 to 1 mol/L, further preferably 0.1 to 0.7 mol/L, in view of achieving satisfactory plating solution stability and plating rate. The preferred pH of the solution depends on the reducing agent. In the case of using formaldehyde as the reducing agent, the pH is preferably 10 to 13.5, more preferably 11 to 12.8. In the case of using phosphinic acid as the reducing agent, the pH is preferably 8 to 13.

<Conductive Material Producing Apparatus>

An embodiment of a producing apparatus capable of easily subjecting the long base material to be plated 24 shown in FIG. 1D to the above electrification treatment and electroless plating treatment will be described below with reference to FIGS. 4 to 7. Of course, this producing apparatus can be used for the material having the conductive fine particles deposited by the printing or photoresist process.

Figure 4A:
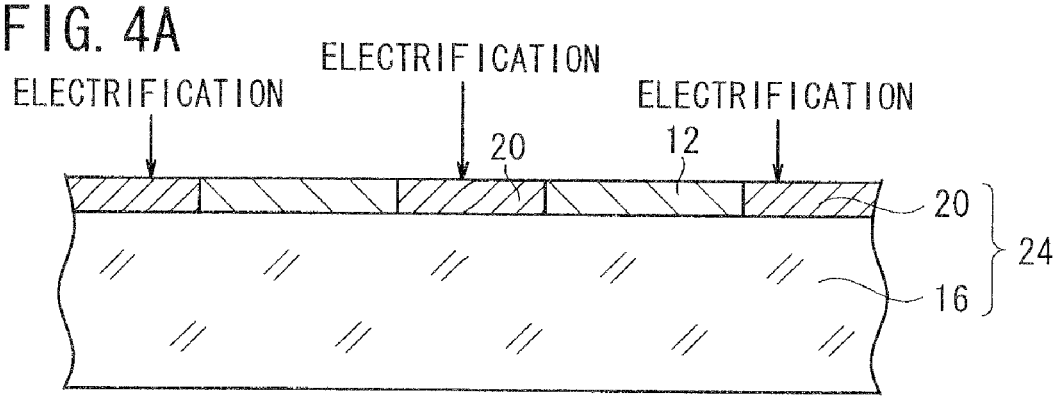
FIG. 4A is a view showing the electrification step.
Figure 4B:
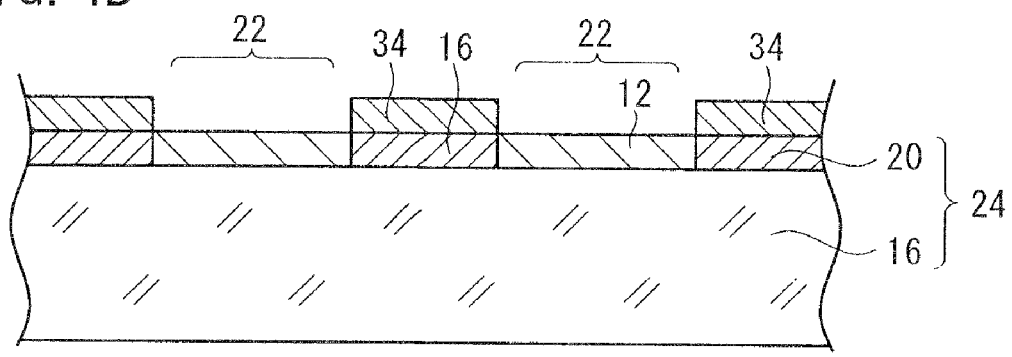
FIG. 4B is a view showing the electroless plating step.

By using the producing apparatus, the base material to be plated 24 is electrified in the metal ion-containing solution using the metallic silver portion 20 as a cathode as shown in FIG. 4A, and then the electrification-treated base material 24 is subjected to the electroless plating treatment, whereby a plated layer 34 is deposited only on the metallic silver portion 20 as shown in FIG. 4B.

Figure 5:
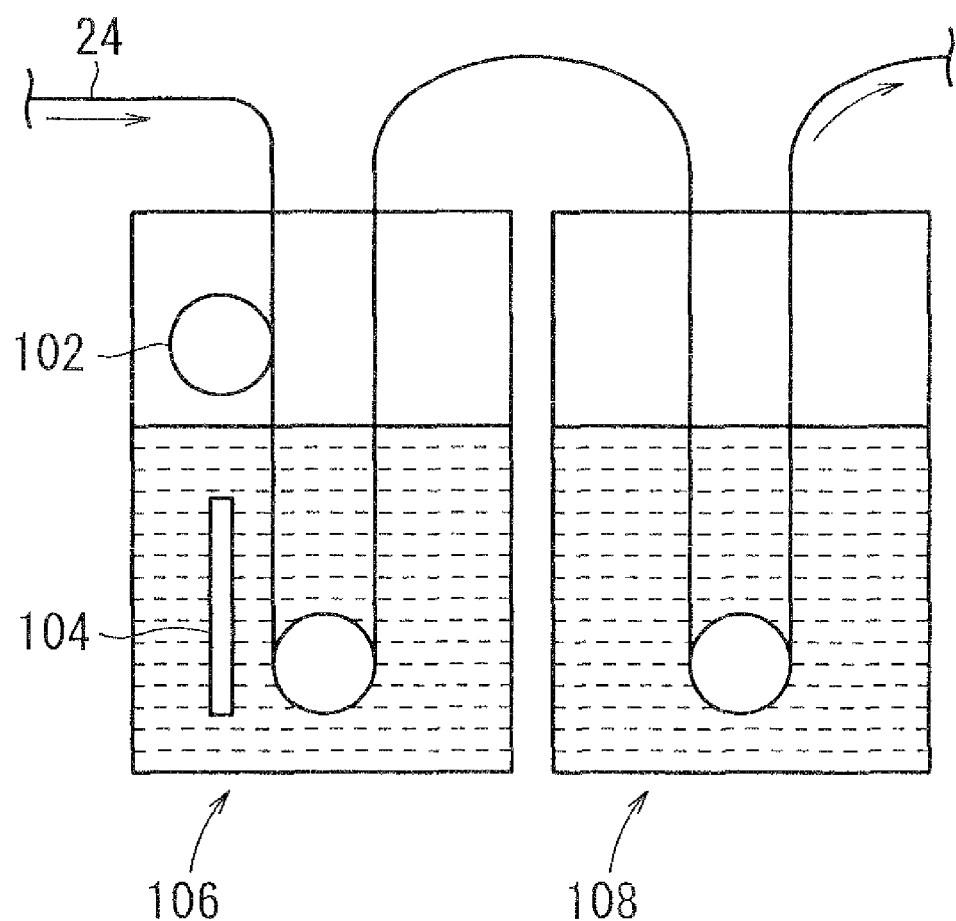
FIG. 5 is an explanatory schematic view showing an apparatus for producing a conductive material according to an embodiment of the present invention.

As shown in FIG. 5, a producing apparatus 100 according to this embodiment may be such that an electrifying unit 106 having a metal feed roller 102 and an anode 104, and an electroless plating unit 108 are disposed in this order in the direction of conveying the base material 24, whereby the base material 24 is subjected to the electrification treatment and the electroless plating treatment in this order.

The electrifying unit 106 and the electroless plating unit 108 will be described in detail below.

[Electrifying Unit 106]

In the electrifying unit 106 according to this embodiment, the base material to be plated 24, which is exposed and developed to form the fine-wire metallic silver portion 20, is electrified, so that the metallic silver portion 20 is activated.

Figure 6:
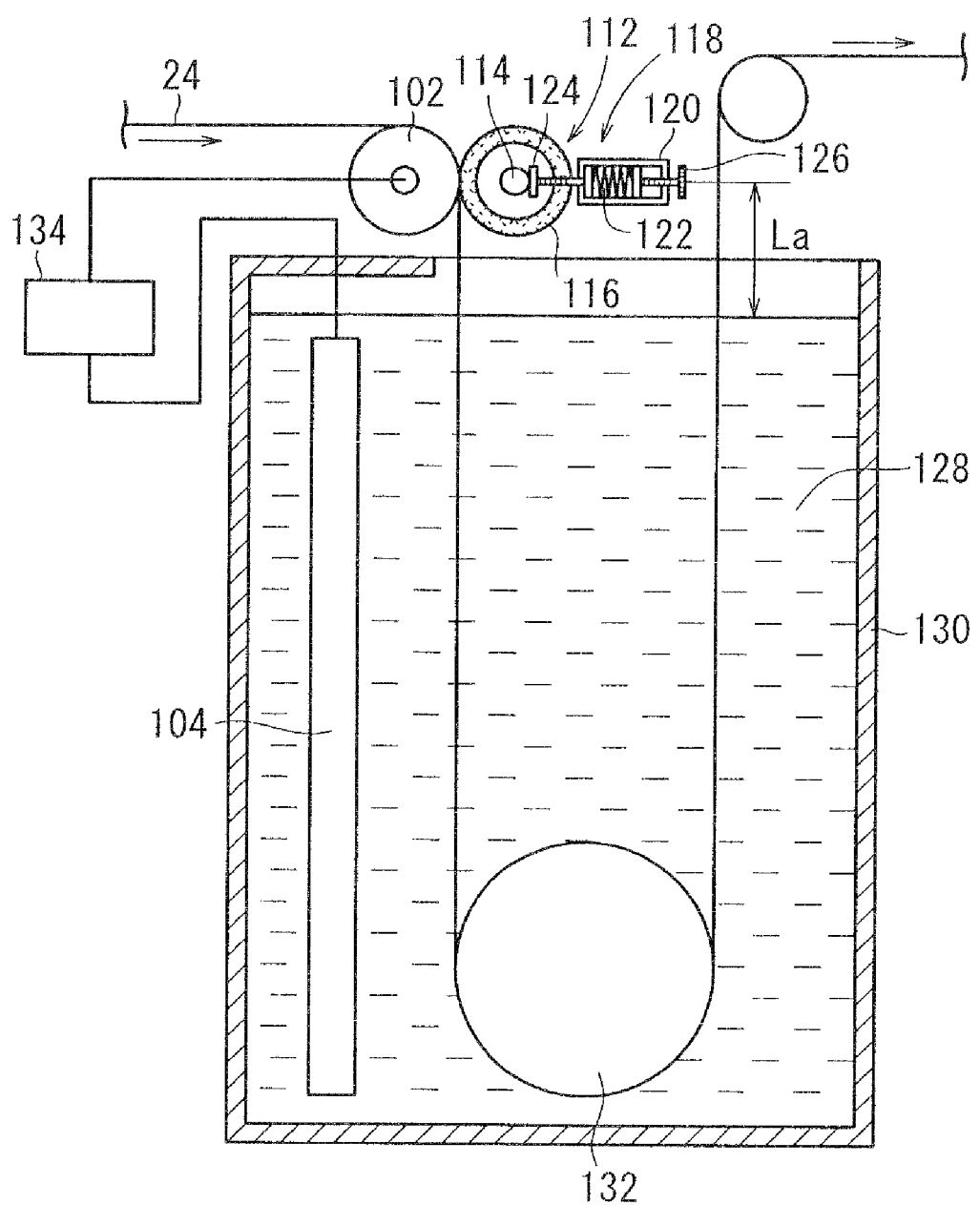
FIG. 6 is a schematic view showing an electrifying unit, preferably used in the apparatus for producing a conductive material according to the embodiment.

Specifically, for example, as shown in FIG. 6, the electrifying unit 106 has the feed roller 102, which is brought into contact with the metallic silver portion 20 of the base material to be plated 24 and applies electricity to the metallic silver portion 20. An elastic roller 112 for pressing the metallic silver portion 20 of the base material 24 to the feed roller 102 is disposed on substantially the same level as the feed roller 102 with the base material 24 in-between.

The elastic roller 112 has a rotatably supported shaft 114 and a surface elastic layer 116. The elastic layer 116 is composed of a urethane rubber, etc. A pressing device 118 is disposed on each end of the shaft 114 in the elastic roller 112 such that the rotation of the shaft 114 is not inhibited by the pressing device 118. The pressing device 118 has a casing 120 and a spring 122 disposed therein. A contact member 124 is pressed toward the shaft 114 by the spring 122. The back side of the spring 122 is in contact with an adjusting screw 126 disposed on the casing 120. A force for pressing the base material to be plated 24 to the feed roller 102 can be changed by controlling the engaging position of the adjusting screw 126.

The electrifying unit 106 has an electrifying bath 130 filled with a metal ion-containing activation solution 128, disposed downstream of the feed roller 102 in the direction of conveying the base material to be plated 24.

In the electrifying unit 106, the base material to be plated 24 is conveyed by an in-liquid roller 132 in the metal ion-containing activation solution 128 in the electrifying bath 130, while the metallic silver portion 20 being in contact with the feed roller 102. Electricity is applied by a direct-current power source 134 to the cathode of the feed roller 102 and the anode 104 placed in the metal ion-containing activation solution 128 in the electrifying bath 130. Thus, the metallic silver portion 20 of the base material 24 is activated.

The feed roller 102 preferably has a metal electrode. The diameter of the feed roller 102 is preferably 1 to 20 cm, particularly preferably 2 to 10 cm. The distance between the feed roller 102 and the metal ion-containing activation solution 128 is preferably 5 mm to 30 cm, particularly preferably 1 to 5 cm. When these values are within the ranges, the distance La between the activation solution 128 and the contact point of the base material 24 and the feed roller 102 can be reduced, whereby the metallic silver portion 20 of the base material 24 can be prevented from being oxidized before the base material 24 is immersed in the activation solution 128. In a particularly preferred embodiment, the distance between the feed roller 102 and the activation solution 128 may be less than 1 cm, and the feed roller 102 may be placed on or in the activation solution 128. In this embodiment, the oxidization of the metallic silver portion 20 of the base material 24 can be more effectively prevented after electrifying the base material 24.

The surface roughness of the feed roller 102 is preferably 1 to 50 μm, particularly preferably 2 to 20 μm, in view of holding and scratching of the base material to be plated 24.

By the electrification treatment using the electrifying unit 106, the surface to be plated of the metallic silver portion 20 on the base material 24 is activated in this manner. Thus, the following plating treatment can be rapidly completed without plating fog, whereby the conductive material can be mass-produced.

The electrifying unit 106 may further have a washing device for washing out the metal ion-containing activation solution 128 or the like attached to the base material 24 after the treatment.

The feed roller 102 is composed of SUS316, SUS316J1 SUS317, or SUS317L, which may be coated with a copper material. The feed roller 102 may have an electrical discharge-treated surface. The surface roughness Ry of the feed roller 102 is preferably at least 5 μm and less than 30 μm, more preferably at least 10 μm and less than 25 μm. The surface roughness Ra thereof is preferably 0.5 to 5 μm, more preferably 1 to 2.5 μm. In the present invention, the surface roughnesses Ry and Ra are values according to JIS B 0601-1994, and may be measured by SJ-400 manufactured by Mitutoyo Corporation.

The elastic layer 116 of the elastic roller 112 is composed of a conductive rubber having a hardness of 10 to 70 degree and a thickness of about 5 mm. In the present invention, the hardness of the elastic layer 116 may be measured by ASKER C manufactured by Kobunshi Keiki Co., Ltd.

The force for pressing the base material to be plated 24 to the feed roller 102 can be changed by controlling the engaging position of the adjusting screw 126 attached to the backside of the spring 122. The pressure in the nip part between the feed roller 102 and the elastic roller 112 is preferably 0.2 to 0.6 MPa, more preferably 0.3 to 0.5 MPa. In the present invention, the pressure may be measured by a two-sheet-type, extremely-ultralow-pressure Fuji Prescale manufactured by FUJIFILM Corporation. The Fuji Prescale contains two films, a coloring agent (microcapsule) is applied to a support of one film, and a developer is applied to the other. When the microcapsule of the coloring agent is broken under the pressure in the nip part, the coloring agent is adsorbed to and chemically reacted with the developer to form a red color.

The feed roller 102 can be brought into substantially uniform contact with the base material to be plated 24 by pressing the elastic roller 112 toward the feed roller 102. When the pressure in the nip part between the feed roller 102 and the elastic roller 112 is less than 0.2 MPa, the feed roller 102 is hardly brought into the substantially uniform contact with the base material 24. On the other hand, when the pressure in the nip part is more than 0.6 MPa, the resistance to the transport of the base material 24 between the feed roller 102 and the elastic roller 112 is increased, so that it is difficult to stably convey the base material 24.

[Electroless Plating Unit 108]

In the electroless plating unit 108, the base material to be plated 24 having the fine-wire metallic silver portion 20 is subjected to the electroless plating treatment, so that a metal is deposited on the metallic silver portion 20 to form the plated layer 34 (see FIG. 4B).

Figure 7:
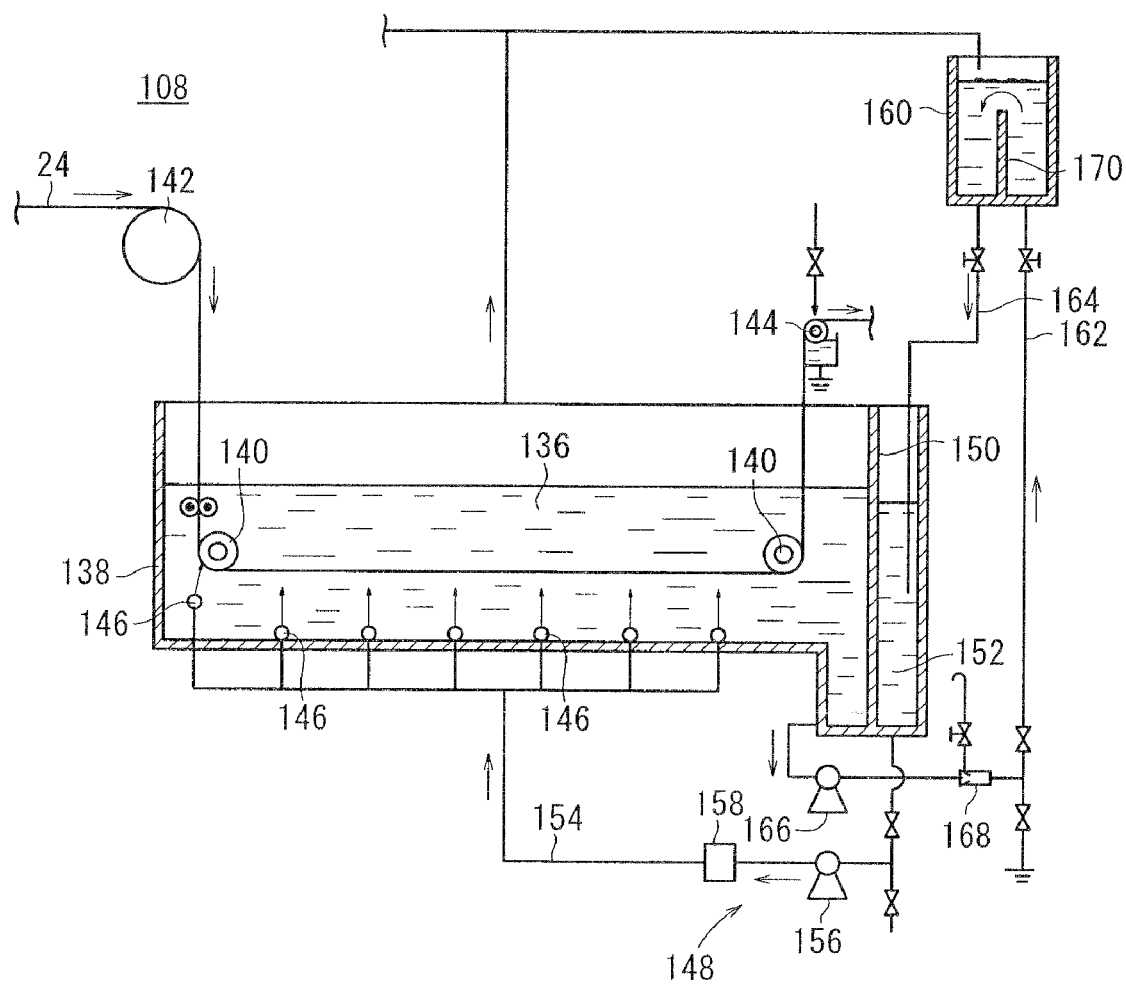
FIG. 7 is a schematic view showing an electroless plating unit, preferably used in the apparatus for producing a conductive material according to the embodiment.

Specifically, as shown in FIG. 7, the electroless plating unit 108 has a plating bath 138 filled with a plating solution 136, and a plurality of support rollers 140 (two support rollers 140 in this embodiment) disposed in the plating bath 138. The base material to be plated 24 is horizontally transported in the plating bath 138. In the electroless plating unit 108, a plurality of transport support rollers 142, 144 for supporting and transporting the base material 24 are disposed upstream and downstream of the plating bath 138.

A known electroless plating technique for a printed circuit board, etc. may be used in the electroless plating treatment. The electroless plating treatment is preferably an electroless copper plating treatment. Specifically, the plating solution 136 is preferably an electroless copper plating solution. Examples of chemical species contained in the electroless copper plating solution include copper sulfate, copper chloride, and the like; reducing agents such as formalin and glyoxylic acid; ligands capable of coordinating to copper such as EDTA, TIPA, and triethanolamine; and additives for stabilizing the bath or improving the smoothness of a plated film, such as polyethylene glycol, yellow prussiate of potash, bipyridine, and thiourea compounds. Further, an additive for improving the stability of the plating solution 136, such as an EDTA ligand, may be contained in the plating solution 136.

The base material to be plated 24 is horizontally conveyed between the support rollers 140, 140 in the plating bath 138, and a plurality of spraying members 146 for spraying a microscopic bubble gas-liquid mixture fluid toward the base material 24 are arranged below the base material 24 along the path thereof. The microscopic bubble gas-liquid mixture fluid (plating solution containing microscopic bubbles) is a mixture fluid of the plating solution 136 and air, and a gas-liquid mixture supplying device 148 is used to supply the microscopic bubble gas-liquid mixture fluid to the spraying members 146.

The gas-liquid mixture supplying device 148 has a pipe 154 for connecting the bottom of a supply portion 152 and the spraying members 146. The supply portion 152 is divided from the plating bath 138 by a partition 150, and a circulating pump 156 and a filter 158 are disposed on the pipe 154. Further, the gas-liquid mixture supplying device 148 has an air bubble removing bath 160 above the plating bath 138, and has pipes 162, 164 for connecting the bottom of the plating bath 138 to the supply portion 152 through the air bubble removing bath 160. A circulating pump 166 and a gas-liquid mixer 168 are disposed on the pipe 162.

The microscopic bubble gas-liquid mixture fluid is introduced through the gas-liquid mixer 168 and the pipe 162 to the air bubble removing bath 160. The pipe 162 is connected to the bottom of the air bubble removing bath 160, and a shuttering board 170 is disposed in the air bubble removing bath 160 below the liquid surface. The pipe 164 is connected to the bottom of the air bubble removing bath 160, and is inserted to the top of the supply portion 152. The pipe 162 and the pipe 164 are connected to the air bubble removing bath at opposite sides of the shuttering board 170. The microscopic bubble gas-liquid mixture fluid is introduced through the pipe 162 to the bottom of the air bubble removing bath 160, and air bubbles in the fluid float on the liquid surface. Thus, the air bubbles are removed from the microscopic bubble gas-liquid mixture fluid, and then the fluid is moved over the shuttering board 170 to the supply portion 152 through the pipe 164 connected to the bottom of the air bubble removing bath 160.

The microscopic bubble gas-liquid mixture fluid in the supply portion 152 is introduced through the pipe 154 connected to the bottom of the supply portion 152 and the filter 158 to the spraying members 146, and sprayed from the spraying members 146 onto the base material to be plated 24. When the base material 24 is conveyed in the plating solution 136 in the plating bath 138, the metallic silver portion 20 of the base material 24 is electroless-plated. Further, by spraying the microscopic bubble-liquid mixture, the plating solution 136 in the plating bath 138 can be stirred, mixed, and thereby uniformized.

EXAMPLES

The present invention will be described more specifically below with reference to Examples. Materials, amounts, ratios, treatment contents, treatment procedures, and the like, used in Examples, may be changed without departing from the scope of the invention. The following embodiments are, therefore, to be considered in all respects as illustrative and not restrictive.

Example 1

Preparation of Conductive Base Material A)

A base material was prepared by the following procedure, and coated with a photosensitive silver halide material. The photosensitive silver halide material was exposed in a mesh pattern and developed, whereby conductive fine particles of developed silver were deposited on the base material. The conductive fine particles formed a mesh pattern of lines, which were disposed at a regular interval at angles of 45° and 135° against the longitudinal direction of the ribbon-shaped base material. The mesh pattern had a line width of 12 μm and a space width of 288 μm. Thus obtained conductive base material is referred to as a conductive base material A. The conductive base material A had a surface resistance of 200 Ω/sq and a transmittance of 85% to a D65 light source. The surface resistance was measured by LORESTA GP manufactured by Mitsubishi Chemical Corporation, utilizing a four-probe method.

<Preparation of Base Material>

The emulsion surface and back surface of a biaxially stretched polyethylene terephthalate support having a thickness of 100 μm were each coated with a first undercoat layer and a second undercoat layer having the following compositions in this order. The layers were formed by a bar coating method, and the support was subjected to a corona discharge treatment before the coating.

| [Emulsion surface] (First undercoat layer) | |
|---|---|
| Styrene-butadiene copolymer latex | 15 g |
| 2,4-Dichrolo-6-hydroxy-s-triazine | 0.25 g |
| Fine polystyrene particles (average particle diameter 3 μm) | 0.05 g |
| Compound Cpd-20 | 0.20 g |
| Colloidal silica (SNOWTEX ZL, particle diameter: 70 to 100 μm, available from Nissan Chemical Industries, Ltd.) | 0.12 g |
| Total (containing water) | 100 g |

Further, 10% by weight of KOH was added to the above composition to adjust the pH to 6, and the resultant coating liquid was applied such that the dry thickness of the first undercoat layer was 0.9 μm after drying at 180° C. for 2 minutes.

| (Second undercoat layer) | |
|---|---|
| Gelatin | 1 g |
| Methyl cellulose | 0.05 g |
| Compound Cpd-21 | 0.02 g |
| $C_{12}H_{25}O(CH_2CH_2O)_{10}H$ | 0.03 g |
| Proxel | $3.5 \times 10^{-3}$ g |
| Acetic acid | 0.2 g |
| Total (containing water) | 100 g |

The coating liquid having the above composition was applied such that the dry thickness of the second undercoat layer was 0.1 μm after drying at 170° C. for 2 minutes.

[Back surface]
(First undercoat layer)

| | |
|---|---|
| Acrylic latex | 1 g |
| Anionic surfactant | 0.06 g |
| Nonionic surfactant | 0.06 g |
| Sb-doped $SnO_2$ fine particles | 0.3 g |
| Fine spherical silica particles (average particle diameter 0.3 μm) | 0.05 g |
| Carbodiimide crosslinking agent | 0.05 g |
| Total (containing water) | 100 g |

The coating liquid having the above composition was applied such that the dry thickness of the first undercoat layer was 0.9 μm after drying at 180° C. for 2 minutes.

(Second undercoat layer)

| | |
|---|---|
| Acrylic latex | 1 g |
| Anionic surfactant | 0.06 g |
| Carnauba wax dispersion | 0.05 g |
| Epoxy crosslinking agent | 0.05 g |
| Total (containing water) | 100 g |

The coating liquid having the above composition was applied such that the dry thickness of the second undercoat layer was 0.1 μm after drying at 170° C. for 2 minutes.

<Preparation of Silver Halide Emulsion A>

An aqueous alkali halide solution containing silver nitrate, sodium chloride, and potassium bromide was added to an aqueous gelatin solution while being stirred by a controlled double jet method, and a potassium iodide solution was further added thereto. Potassium hexachloroiridate (III) and ammonium hexachlororhodate were added to the alkali halide, whereby particles were doped with Rh and Ir ions. The amount of each of the Rh and Ir ions was $10^{-7}$ mol per 1 mol of silver.

The resultant was water-washed and demineralized by a flocculation method, and gelatin was added thereto to adjust the pH at 5.6 and the pAg at 7.5. Sodium benzenethiosulfonate, sodium benzenethiosulfinate, and 1,3,3a,7-tetrazaindene were added thereto, and further sodium thiosulfate and chlorauric acid were added to conduct a chemical sensitization for achieving an optimum sensitivity at 55° C. The amount of each of the sodium benzenethiosulfonate, sodium benzenethiosulfinate, and 1,3,3a,7-tetrazaindene was $10^{-4}$ mol per 1 mol of silver.

A cubic silver iodochlorobromide particle emulsion A, which contained 70 mol % of silver chloride, 29.2 mol % of silver bromide, and 0.08 mol % of silver iodide, and had an average particle diameter of 0.18 μm and a variation coefficient of 7%, was prepared in this manner.

<Preparation of Photosensitive Silver Halide Material A>

The base material was coated simultaneously with a UL layer and an emulsion layer having the following compositions in this order to obtain a photosensitive silver halide material A. The preparation, coating amount, and coating method of each layer are described below.

(Emulsion Layer)

$5.7 \times 10^{-4}$ mol/mol-Ag of a sensitizing dye SD-2 was added to the emulsion A to conduct spectral sensitization. $3.4 \times 10^{-4}$ mol/mol-Ag of KBr and $8.0 \times 10^{-4}$ mol/mol-Ag of a compound Cpd-3 were added to the emulsion, and further $1.2 \times 10^{-4}$ mol/mol-Ag of 1,3,3a,7-tetrazaindene, $1.2 \times 10^{-2}$ mol/mol-Ag of hydroquinone, $3.0 \times 10^{-4}$ mol/mol-Ag of citric acid, and surfactants Sa-1, Sa-2, and Sa-3 (application amount 60 mg/m², 40 mg/m² and 2 mg/m²) were added thereto. Thus obtained emulsion layer coating liquid was applied to a support to be hereinafter described. The amounts of Ag and gelatin applied were 2.0 g/m² and 0.3 g/m², respectively.

(UL layer)

| | |
|---|---|
| Gelatin | 1.0 g/m² |
| Compound Cpd-7 | 40 mg/m² |
| Compound Cpd-YF | 50 mg/m² |
| Antiseptic agent Proxel | 1.5 mg/m² |

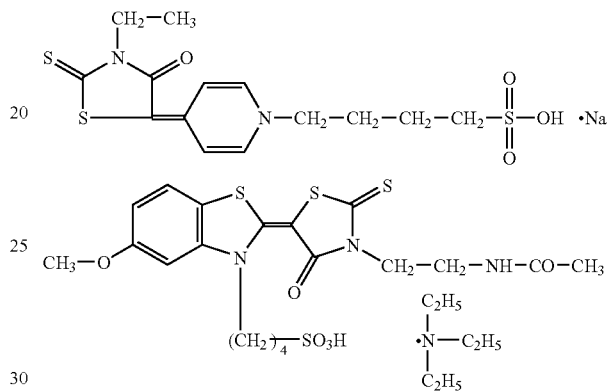

(SD-2) MIXTURE OF 1:2 MOLE RATIO

Cpd-YF

SD-1

Cpd-3

(UL layer)

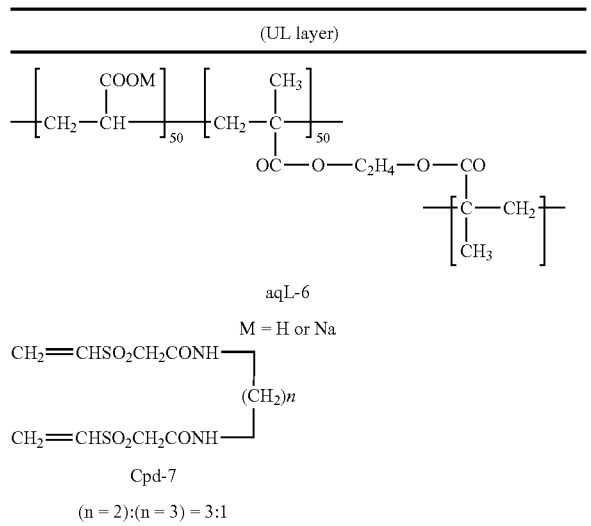

aqL-6

M = H or Na

Cpd-7

(n = 2):(n = 3) = 3:1

The resultant emulsion layer had an applied silver amount of 2.0 g/m², an Ag/gelatin weight ratio of 6.7, and a swelling ratio of 1.9. The photosensitive silver halide material A had the emulsion layer as the uppermost layer.

The swelling ratio of the emulsion layer was obtained as follows. A segment of a sample was observed by a scanning electron microscope during a drying process, to obtain a thickness (a) of the emulsion layer during drying. The segment was immersed in distilled water having a temperature of 25° C. for 1 minute, freeze-dried using liquid nitrogen, and observed by the scanning electron microscope, to obtain a thickness (b) of the swelled emulsion layer. The swelling ratio was calculated using the following formula: Swelling ratio (%)=100×((b)−(a))/(a).

The above liquid was applied to a PET support having a width of 30 cm. The liquid was applied into a width of 28 cm and a length of 100 m, and the both end portions having width of 1.5 cm of the PET support were cut off to obtain a roll photosensitive silver halide material having a width of 27 cm.

<Exposure>

The photosensitive silver halide material A was exposed by using a continuous exposure apparatus. In the apparatus, exposure heads using a DMD (a digital mirror device) described in an embodiment of Japanese Laid-Open Patent Publication No. 2004-1244 were arranged into a width of 55 cm. The exposure heads and exposure stages were arranged on a curved line to concentrate laser lights onto the photosensitive layer of the photosensitive material. Further, in the apparatus, a feeding mechanism and a winding mechanism for the photosensitive material were disposed, and a buffering bend was formed such that the speed in the exposure part was not affected by change of the exposure surface tension, and feeding and winding speeds. The light for the exposure had a wavelength of 405 nm and a beam shape of 12-μm square, and the output of the laser light source was 100 μJ.

The photosensitive material was exposed in a lattice pattern with a width of 27 cm and a length of 75 cm. In the pattern, 12-μm pixels were tilted at 45 degrees to the longitudinal direction at a pitch of 300 μm.

<Development>

The exposed photosensitive material was treated with a developer and a fixer having the following compositions by using an automatic processor FG-710PTS manufactured by FUJIFILM Corporation. The development treatment was carried out at 35° C. for 30 seconds, the fixation treatment was carried out at 34° C. for 23 seconds, and then a water washing treatment was carried out for 20 seconds at a water flow rate of 5 L/min. The conductive base material A having the conductive fine particles of the developed silver on the base material was prepared in this manner.

| (Composition of developer) | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| Total (containing tap water) | 1000 ml |
| pH | Adjusted at 10.3 |

| (Composition of fixer) | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| Total (containing tap water) | 1000 ml |
| pH | Adjusted at 6.2 |

<Electrification>

The obtained conductive base material A was subjected to an electrification treatment 1-1 using a metal ion-containing activation solution 1-1 having the following composition.

(Electrification Treatment 1-1)

A cylindrical stainless feed roller having a diameter of 1 cm was placed as a power feeding electrode at a distance of 2 cm from the liquid surface of the activation solution 1-1. A nipping rubber roller was placed in the vicinity of the feed roller, and the conductive base material A was transported to and perpendicularly immersed in the activation solution while being nipped between the feed roller and the rubber roller. A plate-shaped phosphorus-containing copper positive electrode was placed as a positive electrode in the activation solution at a distance of 2 cm from the conductive base material A. The base material A was disposed such that the conductive layer surface was in contact with the feed roller and faced the positive electrode. A voltage was applied to the feed roller and the positive electrode by an external direct-current power source, whereby the electrification treatment was carried out in the metal ion-containing solution using the conductive fine particles as a cathode. The activation solution had a temperature of 25° C. in the electrification treatment, and the stationary conductive base material A having a width of 27 cm was electrified at 2.7 A (0.67 A/dm² in current density) for 3 seconds. The feed roller was composed of a stainless steel, and had a hydrogen overvoltage of −0.1 V vs. NHE. The mesh pattern (the conductive metal portion) formed by the exposure and development had a hydrogen overvoltage of −0.2 V vs. NHE.

(Preparation of Activation Solution 1-1)

The metal ion-containing activation solution 1-1 had the following composition. The solvent was pure water.

| | |
|---|---|
| Copper sulfate pentahydrate | 0.015 mol/L |
| EDTA (ethylenediaminetetraacetic acid sodium salt) | 0.06 mol/L |
| pH (controlled by NaOH addition) | 12.5 |

Electroless Plating Treatment

The conductive base material A, which was subjected to the electrification treatment 1-1, was washed with a tap water at 25° C. for 1 minute. Then, the conductive base material A was subjected to an electroless plating treatment using an electroless plating solution having the following composition, and water-washed and dried to obtain a sample 1-1 according to the present invention.

(Electroless Plating Solution Composition and Electroless Plating Treatment Conditions)

The electroless plating solution was an electroless Cu plating solution having a pH of 12.5, which contained 0.06 mol/L of copper sulfate, 0.2 mol/L of formalin, 0.24 mol/L of EDTA, 100 ppm of polyethylene glycol, 10 ppm of yellow prussiate of potash, and 10 ppm of 2,2'-bipyridyl. The electroless copper plating treatment was carried out at 55° C. for 10 minutes.

(Production of Samples 1-2 to 1-12)

Samples 1-2 to 1-12 were produced in the same manner as the sample 1-1 except for changing the activation solution used in the electrification treatment and the electrification conditions to those shown in Table 1. The activation solutions shown in Table 1 had the following compositions.

(Activation Solution 1-2)

The activation solution 1-2 was prepared in the same manner as the activation solution 1-1 except that 0.06 mol/L of potassium pyrophosphate was used instead of EDTA and the pH was controlled at 8.

(Activation Solution 1-3)

The activation solution 1-3 was prepared in the same manner as the activation solution 1-1 except that 0.06 mol/L of Rochelle salt (potassium sodium tartrate) was used instead of EDTA and the pH was controlled at 12.5.

(Activation Solution 1-4)

The activation solution 1-4 was prepared in the same manner as the activation solution 1-1 except that 0.03 mol/L of triethanolamine was used instead of EDTA and the pH was controlled at 12.5.

(Activation Solution 1-5)

The activation solution 1-5 was prepared in the same manner as the activation solution 1-1 except that EDTA and NaOH were not added and an aqueous solution containing 0.015 mol/L of copper sulfate pentahydrate was obtained.

(Activation Solution 1-6)

The activation solution 1-6 was an aqueous solution containing 0.015 mol/L of nickel sulfate.

(Activation Solution 1-7)

The activation solution 1-7 was an aqueous solution containing 0.015 mol/L of ferrous sulfate.

(Activation Solution 1-8)

The activation solution 1-8 was an aqueous solution containing 0.004 mol/L of stannous chloride, 0.004 mol/L of hydrochloric acid, and 0.2 g/L of tiron.

(Activation Solution 1-9)

The activation solution 1-9 was an aqueous solution containing 0.015 mol/L of cobalt sulfate.

(Activation Solution 1-10)

The activation solution 1-10 was prepared in the same manner as the activation solution 1-1 except that the copper sulfate pentahydrate was not added and the amount of NaOH was changed to control the pH at 12.5.

(Activation Solution 1-11)

The activation solution 1-11 was prepared in the same manner as the activation solution 1-1 except that the copper sulfate pentahydrate, EDTA and NaOH were not added.

(Production of Samples 1-13, 1-14)

Samples 1-13 and 1-14 were produced in the same manner as the sample 1-1 except that the electrification conductions were changed to those shown in Table 1 and that the electroless plating is not performed.

[Result]

The production conditions and evaluation results of the samples are shown in Table 1.

TABLE 1

| Sample No. | Activation solution | Metal ion | Complexing agent | pH | Electrifying conditions | Positive electrode | Surface resistance Ω/sq | Relation to present application |
|---|---|---|---|---|---|---|---|---|
| 1-1 | 1-1 | $Cu^{2+}$ | EDTA | 12.5 | 2.7 A 3 seconds | Phosphorus-containing copper | 0.5 | Present invention |
| 1-2 | 1-2 | $Cu^{2+}$ | Potassium pyrophosphate | 8 | 2.7 A 3 seconds | Oxygen-free copper | 0.7 | Present invention |
| 1-3 | 1-3 | $Cu^{2+}$ | Rochelle salt | 12.5 | 2.7 A 3 seconds | Phosphorus-containing copper | 0.6 | Present invention |
| 1-4 | 1-4 | $Cu^{2+}$ | Triethanolamine | 12.5 | 2.7 A 3 seconds | Phosphorus-containing copper | 0.6 | Present invention |
| 1-5 | 1-5 | $Cu^{2+}$ | None | Not controlled | 2.7 A 3 seconds | Phosphorus-containing copper | 0.5 | Present invention |
| 1-6 | 1-6 | $Ni^{2+}$ | None | Not controlled | 2.7 A 3 seconds | Electrolytic nickel | 1.0 | Present invention |
| 1-7 | 1-7 | $Fe^{2+}$ | None | Not controlled | 2.7 A 3 seconds | SUS304 | 0.9 | Present invention |
| 1-8 | 1-8 | $Sn^{2+}$ | None | Not controlled | 2.7 A 3 seconds | Tin | 1.2 | Present invention |
| 1-9 | 1-9 | $Co^{2+}$ | None | Not controlled | 2.7 A 3 seconds | Cobalt | 1.5 | Present invention |

TABLE 1-continued

| Sample No. | Activation solution | Metal ion | Complexing agent | pH | Electrifying conditions | Positive electrode | Surface resistance Ω/sq | Relation to present application |
|---|---|---|---|---|---|---|---|---|
| 1-10 | 1-10 | None | EDTA | 12.5 | 2.7 A 3 seconds | Phosphorus-containing copper | 200 | Comparative example |
| 1-11 | 1-11 | None | None | Not controlled | 2.7 A 3 seconds | Phosphorus-containing copper | *[1]Not measurable | Comparative example |
| 1-12 | 1-1 | $Cu^{2+}$ | EDTA | 12.5 | None | None | 210 | Comparative example |
| 1-13*[2] | 1-1 | $Cu^{2+}$ | EDTA | 12.5 | 2.7 A 3 seconds | Phosphorus-containing copper | 205 | Comparative example |
| 1-14*[2] | 1-1 | $Cu^{2+}$ | EDTA | 12.5 | 2.7 A 1 minute | Phosphorus-containing copper | 200 | Comparative example |

*[1]Broken immediately after electrification
*[2]No electroless plating after electrification The samples according to the present invention had copper metal layer meshes formed by the electroless copper plating treatments. As shown in Table 1, the conductive material samples having the conductive metal layers were effectively produced with lowered surface resistances.

In contrast, the sample electrified in the activation solution free of metal ions and the sample not electrified using the metal ion-containing activation solution did not have a plated copper layer, and the surface resistances thereof were not lowered. The surface resistance was obtained by measuring the center in the width direction of each sample at a position 2-cm below the liquid surface in the electrification using the above described meter.

Further the sample 1-13 was produced in the same manner as the samples 1-1 to 1-9 except that the electroless plating treatments were not carried out after the electrification in the metal ion-containing activation solution. The sample 1-14 was also prepared in the same manner as the sample 1-13 except for the electrification time prolonged. The surface resistance values of the samples were measured. As a result, the samples were not lowered in the surface resistance. As is clear from that the above, a conductive metal layer is hardly formed in the electrification in the metal ion-containing activation solution according to the present invention. The electrification in the metal ion-containing activation solution according to the present invention is carried out to increase the activity of the base material in the following electroless plating step, and is greatly different from conventional electroplating treatments for forming a metal layer.

Example 2

Conductive Materials Were Produced and Evaluated as Follows (Production of Sample 2-1)

A sample 2-1, a conductive material according to the present invention, was produced in the same manner as the sample 1-1 of Example 1 except for adding 30 mg/L of sodium chloride, 100 mg/L of PEG1000, 10 mg/L of Janus green B, and 10 mg/L of bis(3-sulfopropyl) disulfide to the activation solution.

(Production of Samples 2-2 to 2-17)

Samples 2-2 to 2-17 were produced respectively in the same manner as the sample 2-1 except for changing the metal ion content, the complexing agent content, and the pH and the electrification conditions of the activation solution to those shown in Table 2. The pH was controlled by addition of NaOH or sulfuric acid. The produced samples were evaluated in terms of the following values.

(Surface Resistance)

The surface resistance of each sample was measured in the same manner as in Example 1 after the electroless plating.

(Roughness)

After the electroless plating, a portion of the plated layer of each sample, disposed just below the activation solution surface, was visually observed to evaluate the appearance. The appearance was evaluated and shown in Table 2 using the following standard.

5: The roughness of the plated layer was not observed, and the plated layer had an excellent appearance.

4: The roughness was slightly observed, and the plated layer had a good appearance.

3: The roughness was partly observed, and the plated layer had a slight disadvantage in appearance in a particular use.

2: The roughness was significantly observed, and the plated layer had a disadvantage in appearance.

1: The electroless-plated layer was not formed, and the roughness could not be evaluated.

(Expansion)

The size of a region, in which the metal layer was formed by the electroless plating in each electroless-plated sample, was measured. The size of the region was evaluated and shown in Table 2 using the following standard. A portion having a surface resistance value of 5 Ω/sq or less was considered as the region with the metal layer, and the length of the region was measured at the center in the width direction of each sample.

5: The grown metal layer had a length of 7 cm or more.

4: The grown metal layer had a length of at least 5 cm but less than 7 cm.

3: The grown metal layer had a length of at least 3 cm but less than 5 cm.

2: The grown metal layer had a length of at least 1 cm but less than 3 cm.

1: The grown metal layer had a length of less than 1 cm.

[Result]

The production conditions and evaluation results of the samples are shown in Table 2.

TABLE 2

| Sample No. | Activation solution | Metal ion | Complexing agent | pH | Metal ion content mol/L | Complexing agent content mol/L | Electrifying conditions | Surface resistance Ω/sq | Roughness | Expansion | * |
|---|---|---|---|---|---|---|---|---|---|---|---|
| 2-1 | 2-1 | $Cu^{2+}$ | EDTA | 12.5 | 0.015 | 0.06 | 2.7 A 3 seconds | 0.5 | 5 | 4 | P |
| 2-2 | 2-2 | $Cu^{2+}$ | EDTA | 12.5 | 0.005 | 0.02 | 2.7 A 3 seconds | 1.0 | 5 | 5 | P |
| 2-3 | 2-3 | $Cu^{2+}$ | EDTA | 12.5 | 0.0004 | 0.0016 | 2.7 A 3 seconds | 2.5 | 5 | 5 | P |
| 2-4 | 2-4 | $Cu^{2+}$ | EDTA | 12.5 | 0.06 | 0.24 | 2.7 A 3 seconds | 0.4 | 5 | 4 | P |
| 2-5 | 2-5 | $Cu^{2+}$ | EDTA | 12.5 | 0.2 | 0.8 | 2.7 A 3 seconds | 0.3 | 4 | 3 | P |
| 2-6 | 2-6 | $Cu^{2+}$ | None | 4.0 | 0.015 | None | 2.7 A 3 seconds | 0.5 | 3 | 3 | P |
| 2-7 | 2-7 | $Cu^{2+}$ | None | 4.0 | 0.0004 | None | 2.7 A 3 seconds | 1.0 | 3 | 3 | P |
| 2-8 | 2-8 | $Cu^{2+}$ | None | 4.0 | 0.2 | None | 2.7 A 3 seconds | 0.6 | 2 | 2 | P |
| 2-9 | 2-9 | $Cu^{2+}$ | None | 0.0 | 0.2 | None | 2.7 A 3 seconds | 0.5 | 2 | 2 | P |
| 2-10 | 2-10 | $Cu^{2+}$ | None | 0.0 | 1.0 | None | 2.7 A 3 seconds | 0.4 | 2 | 2 | P |
| 2-11 | 2-11 | $Cu^{2+}$ | EDTA | 12.5 | 0.015 | 0.03 | 2.7 A 3 seconds | 0.5 | 5 | 4 | P |
| 2-12 | 2-12 | $Cu^{2+}$ | EDTA | 12.5 | 0.015 | 0.12 | 2.7 A 3 seconds | 0.6 | 4 | 4 | P |
| 2-13 | 2-1 | $Cu^{2+}$ | EDTA | 12.5 | 0.015 | 0.06 | 2.7 A 10 seconds | 0.5 | 4 | 5 | P |
| 2-14 | 2-1 | $Cu^{2+}$ | EDTA | 12.5 | 0.015 | 0.06 | 2.7 A 0.1 seconds | 0.5 | 4 | 2 | P |
| 2-15 | 2-1 | $Cu^{2+}$ | EDTA | 12.5 | 0.015 | 0.06 | 0.9 A 3 seconds | 0.6 | 4 to 5 | 3 | P |
| 2-16 | 2-1 | $Cu^{2+}$ | EDTA | 12.5 | 0.015 | 0.06 | 0.9 A 9 seconds | 0.5 | 5 | 4 | P |
| 2-17 | 2-1 | $Cu^{2+}$ | EDTA | 12.5 | 0.015 | 0.06 | None | 210 | 1 | 1 | C |

Column "*": "P" represents the present invention and "C" represents the comparative example The samples according to the present invention, other than the not electrified samples, had plated copper layers formed by the electroless plating and lowered surface resistances. Thus, a conductive material containing a conductive metal can be produced by the method of the present invention. The samples within the metal ion content, the ratio of the metal ion to the complexing agent, the amount of current in the electrification according to the preferred embodiments of the present invention achieves the effects of the present invention. It is clear from Table 2 that the roughness and expansion of the electroless plating can be improved by adding a complexing agent to the metal ion-containing activation solution according to the present invention and by appropriately controlling the metal ion content. The samples 2-8 to 2-10 were produced using the activation solutions similar to a conventional copper electroplating solution, which did not contain complexing agents, had an increased copper ion content, and had a pH controlled by sulfuric acid. Therefore, the samples 2-8 to 2-10 were rough and insufficient in the expansion, though they had the conductive layer. It is clear also from the results that the electrification in the metal ion-containing activation solution according to the present invention is different from conventional electroplating treatments.

Example 3

Conductive materials could be produced in the same manner as the samples 1-1 and 1-6 of Example 1 except for changing the above electroless plating solutions to the following nickel plating solutions.

| (Electroless nickel plating solution composition and electroless nickel plating condition) | |
|---|---|
| Nickel sulfate | 25 g/L |
| Sodium hypophosphite | 20 g/L |
| Sodium acetate | 10 g/L |
| Sodium citrate | 10 g/L |
| pH | 5.0 |
| Treatment temperature | 90° C. |

Example 4

A conductive material could be produced in the same manner as the sample 1-1 of Example 1 except for using a conductive base material B prepared by printing conductive fine silver particles on the base material instead of the conductive base material A. The conductive fine particles were printed by a method described in Example 2 of Japanese Laid-Open Patent Publication No. 2007-116137. The method will be described in detail below.

A 100-μm-thick transparent polyethylene naphthalate (PEN) film having a gelatin undercoat layer was used as a transparent plastic base material, and a silver paste to be hereinafter described was screen-printed thereon.

Then, the film was heat-treated at 150° C. for 60 minutes. Thus obtained film had a lattice silver mesh pattern having a line width of 20 μm and a pitch of 300 μm.

(Preparation of Silver Paste)

According to the Carey-Lea method for preparing a silver sol (see, M. Carey Lear *Brit. J. Photog.*, Vol. 24, Page 297 (1877) and ibid., Vol. 27, Page 279 (1880)), a silver nitrate solution was reduced to obtain fine silver particles mainly composed of silver. The solution was subjected to ultrafiltration to remove salt byproducts. Thus obtained fine particles had a particle size of about 10 nm, measured by observation using an electronic microscope.

The particles were mixed with a binder and a solvent containing isopropyl alcohol to prepare the paste.

The weight ratio of silver to the other metals was 96% in the printed pattern.

Example 5

A sample 5-1, a web-shaped conductive material, was produced in the same manner as the sample 2-1 of Example 2 except that the conductive base material A was continuously electrified while conveying the conductive base material A. Thus, the process of electrifying the conductive base material A and the process of transporting the conductive base material A into the metal ion-containing activation solution while nipping between the feed roller and the rubber roller were simultaneously carried out continuously. The electrified web base material was subjected to the electroless plating treatment to obtain the web-shaped conductive material. The conductive base material A was transported for 1 minute at a rate of 3 m/minute, and the electroless plating treatment time was the same as that of Example 2. The web-shaped conductive material having a length of 3 m and a width of 27 cm was produced in this manner. The produced sample 5-1 had a uniform electroless-plated copper layer over approximately entire surface, and had a uniform surface resistance value of about 0.5 Ω/sq except for the ends of the web.

The sample 5-1 was subjected to the following electrolytic copper plating treatment, blackening treatment, and antirust treatment.

The plating bath treatment times and applied voltages are described below. A copper plating solution, a washing water, and an antirust solution had a temperature of 25° C. to 30° C., a blackening solution had a temperature of 45° C., and the drying temperature was 50° C. to 70° C. in the treatments. A plating apparatus used in the treatments was equal to that of Example 1 of Japanese Laid-Open Patent Publication No. 2007-197809. Thus, the plating treatment was carried out using an electrolytic plating apparatus, which had a continuous structure containing an electrolytic plating bath substantially the same as a bath 10 shown in FIG. 1 of the patent publication and a bath for the next treatment connected thereto. Only an inlet side feed roller was used in the treatments, and it was a mirrored stainless steel roller having a diameter of 10 cm and a length of 70 cm. The distance between the plating solution and the contact point of the feed roller and the mesh surface of the film was 9 cm. The line conveying rate was 3 m/minute.

[Composition of copper plating solution (and replenisher solution)]

| | |
|---|---|
| Copper sulfate pentahydrate | 200 g |
| Sulfuric acid (47%) | 200 mL |
| Hydrochloric acid (2N) | 0.5 mL |
| Total (containing pure water) | 1 L |
| pH −0.1 | |

[Composition of blackening solution (and replenisher solution)]

| | |
|---|---|
| Nickel sulfate hexahydrate | 100 g |
| Ammonium thiocyanate | 15 g |
| Zinc sulfate heptahydrate | 20 g |
| Saccharine sodium dihydrate | 1 g |
| Total (containing pure water) | 1 L |
| pH 5.0 (controlled by sulfuric acid and sodium hydroxide) (Antirust solution) | |
| THRU-CUP AT-21 available from C. Uyemura & Co., Ltd. | 100 ml |
| Total (containing pure water) | 1 L |

| | | |
|---|---|---|
| Plating 1 | 30 seconds | Voltage 2 V |
| Water washing | 30 seconds | |
| Drying | 30 seconds | |
| Plating 2 | 30 seconds | Voltage 2 V |
| Water washing | 30 seconds | |
| Water washing | 30 seconds | |
| Drying | 30 seconds | |
| Blackening treatment | 30 seconds | Voltage 5 V |
| Water washing | 30 seconds | |
| Drying | 30 seconds | |
| Blackening treatment | 30 seconds | Voltage 5 V |
| Water washing | 30 seconds | |
| Water washing | 30 seconds | |
| Antirust treatment | 30 seconds | |
| Water washing | 30 seconds | |

The obtained sample was a conductive material containing a transparent base material and a black conductive metal mesh layer formed thereon, and the conductive layer had a total light transmittance of 80%, a haze ratio of 3.5%, and a surface resistance value of 0.1 Ω/sq. The sample had an appearance suitable for use in an electromagnetic shielding film of a plasma display material, etc.

It is clear from this example that the conductive material producing method of the present invention can be combined with an electroplating treatment, a blackening treatment, etc., and the conductive material produced by the method of the present invention can have an excellent transparency suitable for use in a display device and a high conductivity sufficient for the purpose of electromagnetic shielding.

The conductive material producing method and the conductive material producing apparatus of the present invention are not limited to the above embodiments, and various changes and modifications can be made without departing from the scope of the invention.

What is claimed is:

1. A method for producing a conductive material, comprising:
   a depositing step of depositing a conductive fine particle on a surface of a base material;
   an electrifying step of electrifying the base material in a solution containing a metal ion, using the conductive fine particle as a cathode; and
   an electroless plating step of subjecting the base material to an electroless plating treatment to deposit a metal on the conductive fine particle,
   wherein a spherical equivalent diameter of the conductive fine particle, defined as a diameter of a spherical particle having the same volume as the conductive fine particle, is 0.01 to 2 μm,
   a current density in the electrifying step is 0.01 to 10 A/dm2,
   an electrifying time in the electrifying step is 0.01 to 60 seconds, and an amount of metal plated in the electrifying step is $\frac{1}{1000}$ or less times an amount of metal plated in the electroless plating step.

2. A method according to claim 1, wherein the metal ion is an ion of at least one metal selected from the group consisting of iron, nickel, copper, silver, cobalt, zinc and tin.

3. A method according to claim 1, wherein the solution containing the metal ion further contains a complexing agent.

4. A method according to claim 3, wherein the complexing agent comprises at least one salt selected from the group consisting of ethylenediaminetetraacetate, triethanolamine, tartrate, acetate, citrate and pyrophosphate.

5. A method according to claim 3, wherein the complexing agent comprises ethylenediaminetetraacetate.

6. A method according to claim 5, wherein a content of the complexing agent is 0.0001 to 1 mol/L.

7. A method according to claim 1, wherein a content of the metal ion in the solution containing the metal ion is 0.0001 to 1.0 mol/L.

8. A method according to claim 7, wherein the solution containing the metal ion further contains a complexing agent, and a ratio of a content of the complexing agent to the content of the metal ion is 1 to 100.

9. A method according to claim 1, wherein the metal ion in the solution containing the metal ion is an ion of copper, nickel, cobalt or tin.

10. A method according to claim 1, wherein in the depositing step, a photosensitive film having a silver salt emulsion layer containing a silver salt is formed on the base material, and is exposed and developed to form a metallic silver portion.

11. A method according to claim 1, wherein in the depositing step, a paste or an ink containing the conductive fine particle is printed on the base material.

12. A method according to claim 1, wherein in the depositing step, a photosensitive resin layer containing the conductive fine particle is formed on the base material, and is irradiated with a light and developed using a photomask.

* * * * *